(12) United States Patent
Nakazawa et al.

(10) Patent No.: US 8,692,350 B2
(45) Date of Patent: Apr. 8, 2014

(54) SEMICONDUCTOR DEVICE AND METHOD OF MANUFACTURING THE SAME

(75) Inventors: Haruo Nakazawa, Matsumoto (JP);
Takahito Harada, Matsumoto (JP);
Fumio Shigeta, Okaya (JP); Kyohei Fukuda, Matsumoto (JP)

(73) Assignee: Fuji Electric Co., Ltd., Kawasaki (JP)

( * ) Notice: Subject to any disclaimer, the term of this patent is extended or adjusted under 35 U.S.C. 154(b) by 147 days.

(21) Appl. No.: 13/276,740

(22) Filed: Oct. 19, 2011

(65) Prior Publication Data

US 2012/0098085 A1 Apr. 26, 2012

(30) Foreign Application Priority Data

Oct. 21, 2010 (JP) ................................. 2010-236389

(51) Int. Cl.
*H01L 21/70* (2006.01)

(52) U.S. Cl.
USPC .................... 257/506; 438/270; 257/E29.027; 257/21.545

(58) Field of Classification Search
None
See application file for complete search history.

(56) References Cited

U.S. PATENT DOCUMENTS

| | | | |
|---|---|---|---|
| 4,904,609 A | 2/1990 | Temple | |
| 2004/0075160 A1 | 4/2004 | Eng et al. | |
| 2006/0038206 A1 | 2/2006 | Shimoyama et al. | |

FOREIGN PATENT DOCUMENTS

| | | |
|---|---|---|
| JP | 63-241937 | 10/1988 |
| JP | 2-22869 | 1/1990 |
| JP | 7-115100 | 5/1995 |
| JP | 2001-185727 | 7/2001 |
| JP | 2002-76017 | 3/2002 |
| JP | 2004-289047 | 10/2004 |
| JP | 2004-336008 | 11/2004 |
| JP | 2006-503438 | 1/2006 |
| JP | 2006-156926 | 6/2006 |
| JP | 2006-303410 | 11/2006 |
| WO | 2004/036625 A2 | 4/2004 |

OTHER PUBLICATIONS

Machine Translation of 2006-303410.*

* cited by examiner

*Primary Examiner* — Sonya D McCall Shepard

(57) ABSTRACT

A semiconductor device, and method of manufacturing the device, having a p type diffusion layer; a V-groove including a bottom surface parallel to the rear surface and exposing the p type diffusion layer and a tapered side surface rising from the bottom surface; a p type semiconductor layer on the rear surface surrounded by the tapered side surface of the V-groove; and a p type isolation layer formed on the side surface and electrically connecting the p type diffusion layer on the front surface and the p type semiconductor layer on the rear surface. The V-groove has a chamfered configuration around the intersection between a corner part of the side surface and the bottom surface of the V-groove. An object is to prevent performance degradation due to stress concentration at the corner part of a recessed part caused by thermal history in soldering.

8 Claims, 18 Drawing Sheets

SEMICONDUCTOR DEVICE AND METHOD OF MANUFACTURING THE SAME

CROSS-REFERENCE TO RELATED APPLICATIONS

This application is based on, and claims priority under 35 U.S.C. §119 to, Japanese Patent Application No. 2010-236389, filed on Oct. 21, 2010, the content of which is incorporated herein by reference.

BACKGROUND

1. Field

Embodiments of the present invention relate to a semiconductor device such as an IC, a MOS, an IGBT (insulated gate bipolar transistor), and the like, in particular to a bidirectional device or a reverse blocking IGBT, which has bidirectional blocking capability. The embodiments of the present invention also relate to a method of manufacturing such a semiconductor device.

2. Description of the Related Art

The following description is made on a reverse blocking IGBT, a type of semiconductor device. Conventional IGBTs in principal application fields of inverter circuits and chopper circuits are sufficient when provided with a forward withstand voltage. Despite existence of a reverse blocking junction, the conventional IGBTs have been fabricated with the edge of the reverse blocking junction surface exposing to the chip cutting side surface without consideration for holding reliability. In recent years, however, studies are being made on directly linked conversion circuits, for example, a matrix converter, including an AC (alternating current)/AC conversion circuit, a current source type DC (direct current)/AC conversion circuit, and some type of DC/AC conversion circuit such as a new three level circuit employing switching elements having reverse blocking capability, in order to attain reduced size and weight, high efficiency, quick response, and cost reduction.

In order to hold reverse blocking capability of a reverse blocking IGBT, a semiconductor substrate (also referred to as a wafer) after completion of manufacturing processes is cut into a multiple of semiconductor chips with a square shape and the reverse blocking pn junction in each semiconductor chip is extending bent towards the front surface side of the chip in order to avoid exposure to the cut surface in the cutting process. The edge of the pn junction is protected with an insulation film on the front surface to hold reliability. In order for the reverse blocking pn junction to extend to the front surface side, the semiconductor chip needs to comprise a diffusion layer having the same conductivity type, for example p type, as the p type collector layer in the rear surface side of the chip and connecting to the p type collector layer at one end of the p type diffusion layer and extending to the front surface at the other end. This diffusion layer is formed along the side surface of the chip. This diffusion layer formed along the side surface of the chip is referred to as an isolation layer in this specification.

FIGS. 2(a), 2(b), and 2(c) are sectional views of an essential part of a semiconductor substrate showing, in the sequence of processing steps, a method of forming an isolation layer in a conventional reverse blocking IGBT. In the method of the figures, the isolation layer is formed by means of application and diffusion. First, an oxide film 2 for a dopant mask is formed on the wafer 1 in a film thickness of about 2.5 μm by means of a thermal oxidation method as shown in FIG. 2(a). Then, in this oxide film 2, an opening 3 for diffusion of boron which is a p type impurity source is formed by patterning with a photolithography technique and etching as shown in FIG. 2(b). Then, the boron source 5 is applied at the opening 3 followed by heat treatment at a high temperature for a long time in a diffusion furnace to form a p type diffusion layer having a depth of several hundred μm as shown in FIG. 2(c). This p type diffusion layer becomes an isolation layer 4. After that, a front surface side MOS gate structure 10 is formed as shown in FIG. 3, which illustrates a completed reverse blocking IGBT. Then, the wafer is ground from the rear surface side down to the tip of the isolation layer 4 to reduce the thickness of the wafer to the depth indicated by the dotted line in FIG. 2(c). On this ground surface, a rear surface structure composed of a p type collector layer 6 and a collector electrode 7 is formed as shown in FIG. 3. Cutting the wafer along a scribe line at the position of center line in the front surface pattern of the isolation layer 4, a reverse blocking IGBT chip is fabricated as shown by the sectional view including the cut edge 8 in FIG. 3.

FIGS. 4(a), 4(b), and 4(c) are sectional views of an essential part of a wafer of a conventional reverse blocking IGBT showing another manufacturing method for forming an isolation layer in the sequence of processing steps. FIGS. 4(a), 4(b), and 4(c) are sectional views of an essential part of a semiconductor substrate showing the steps, in the sequence of processing steps, in which a trench 11 is dug vertically from the front surface of the wafer 1 and a diffusion layer is formed along the vertical side surface to obtain an isolation layer 4a that works similarly to the isolation layer 4 described previously.

First, a thick oxide film 2 with a thickness of several μm is formed as an etching mask for forming a trench as shown in FIG. 4(a). Then, a deep trench 11 with a depth of several hundred μm is formed by a dry etching technique as shown in FIG. 4(b). Subsequently, an impurity of boron is introduced to the side surface of the trench 11 by vapor phase diffusion to form a p type isolation layer 4a as shown in FIG. 4(c). The trench is filled with reinforcing material of insulation film, polysilicon or the like. Successively, processes as described previously are executed including: back grinding, formation of a front surface side MOS gate structure 10 necessary for an IGBT function, a rear surface p type collector layer 6 and a collector electrode 7. IGBT chips are cut out of the wafer 1 by dicing along scribe lines at the center of the trench 11 or at the middle of doubled trenches that are not illustrated in the figure. Thus, a reverse blocking IGBT is produced as shown in the sectional view including cut edge portion 8 in FIG. 5. This type of reverse blocking IGBT is disclosed in Patent Documents 1, 2, and 3.

In the method of forming an isolation layer of a reverse blocking IGBT by the application and diffusion process as shown in FIGS. 2(a), 2(b), and 2(c), a boron source, which is a diffusion source in a liquid state containing boron, is applied on the wafer surface followed by a thermal diffusion process. The thermal diffusion process needs a high temperature and a long time in order to form a p type isolation layer with a diffusion depth of several hundred μm. Such a thermal diffusion process causes decrease in quartz implements and jigs including a quartz boat, quartz tubes and a quartz nozzle, contamination from the heater, and loss of strength due to devitrification of the quartz implements and jigs. Increased frequency of these phenomena raises manufacturing costs. In the process of forming an isolation layer by the application and diffusion method, a thick oxide film of high quality must be used in order for the mask oxide film to endure the boron diffusion process for a long time and in order to prevent the boron from passing through the oxide film. A method of thermal oxidation is known as a method of forming a silicon oxide film of high quality to obtain a mask of high durability.

In order to exhibit effective durability of a mask oxide film even in the process of forming a p type isolation layer by boron diffusion in such conditions as a high temperature of 1,300° C., for example, and a long time of 200 hr, for example, a thermal oxidation film having a thickness of about 2.5 µm is necessary. For forming a thermal oxidation film with a thickness of 2.5 µm, a necessary oxidation time in the condition of an oxidation temperature of 1,150° C., for example, is about 200 hr for an oxidation process in a dry oxygen atmosphere that gives an oxide film of high quality. In addition, a large amount of oxygen is introduced into the wafer in those oxidation processes. The oxygen generates crystal lattice defects of oxygen precipitates and oxidation-induced stacking faults (OSF), and further produces a phenomenon of donorization of the introduced oxygen, which raises problems of deterioration of device characteristics and degradation of reliability.

The diffusion process after boron source application is usually executed in an oxygen atmosphere at a high temperature and for a long time as well, which introduces interstitial oxygen atoms within the wafer. As a result, this diffusion process also produces oxygen precipitates and donorization phenomenon of the oxygen atoms, and generates lattice defects of the oxidation-induced stacking faults (OSF) and slip dislocations. A pn junction formed in the vicinity of these lattice defects is known to cause a high leakage current and significant degradation in a breakdown voltage and deterioration of reliability of a thermally oxidized film containing such defects in the wafer. A problem also arises that oxygen atoms entered into the wafer during the diffusion process become donors causing degradation of a breakdown voltage. In the method of forming an isolation layer by application and diffusion as shown in FIG. 2, the boron diffusion isotropically proceeds in the bulk silicon towards all directions. As a result, when the boron diffusion is conducted to a depth of 200 µm, the boron diffusion simultaneously expands laterally to a range of 160 µm. This situation obstructs the object of chip size reduction.

In the method of forming an isolation layer utilizing a trench as shown in FIGS. 4(a), 4(b), and 4(c), the trench is formed by a dry etching technique and boron is introduced into the side wall of the formed trench to form a p type isolation layer. Then, the trench is filled with reinforcing material such as an insulation film, polysilicon or the like. The thus formed p type isolation layer 4a shown in FIG. 4(c), utilizing a narrow trench 11 with a high aspect ratio, is favorable for reduction in device pitch as compared with the p type isolation layer 4 shown in FIG. 2(c) formed by thermal diffusion. However, in order to carry out an etching process down to a depth of about 200 µm, a processing time of about 100 minutes is necessary for one wafer using a typical dry etching apparatus. Thus, different drawbacks arise, including an increased lead time and an increased maintenance frequency. For forming a deep trench by a dry etching process using a mask of silicon oxide ($SiO_2$) film, a thick silicon oxide film is with a thickness of several µm since the selection ratio is not larger than 50. As a consequence, new problems arise including degradation of the rate of good products due to generation of process-induced lattice defects such as oxidation-induced stacking faults and oxygen precipitates, as well as increase in manufacturing costs. Moreover, the process for forming an isolation layer utilizing a trench with a high aspect ratio formed by the dry etching technique tends to generate a residue of chemicals 12 and residual resist material 13, which may cause a decrease in yield rate and reliability.

When a dopant such as phosphorus or boron is injected into a side wall of the trench 11, since the side wall is standing vertically, the wafer is normally tilted. The dopant injection to a side wall of a trench with a high aspect ratio has disadvantages including a decrease in effective dose amount, increased injection time, shortening of effective projection range, loss of dose amount due to screen oxide film, and deterioration of injection homogeneity. A method for injecting impurities into a trench 11 with a high aspect ratio avoiding above-mentioned problems is known, which employs vapor phase diffusion instead of ion injection. In this method, the wafer is exposed to vaporized dopant atmosphere, for example, phosphine $PH_3$ or diborane $B_2H_6$. The vapor phase diffusion method is, however, inferior to the ion injection method with respect to controllability of the dose amount. In order to enhance strength of the wafer having a trench 11 with a high aspect ratio, a process step is necessary to fill the trench with an insulation film or polysilicon. This process step tends to leave a void in the narrow trench, which may cause a problem of deteriorated reliability.

A manufacturing method has been proposed to solve the problems discussed thus far. FIG. 17 is a partial plan view of a semiconductor substrate in relation to an etching step for forming an isolation layer in that manufacturing method. The partial plan view of FIG. 17 specifically shows nine reverse blocking IGBT chips divided by passing-through grooves in a pattern of planar lattice formed by etching on the (100) plane 23 of a wafer 1. Since the passing-through V-groove 21a is formed by wet anisotropic etching, the side surfaces of the reverse blocking IGBT are lattice planes represented by {111}. FIGS. 7(a) and 7(b) are sectional views of one chip of the reverse blocking IGBT cut out of the wafer 1 along the passing-through groove 21a indicated in FIG. 17. The double dotted curved lines in FIGS. 7(a) and 7(b) indicate existence of an omitted portion in the figures. The starting place of etching for forming the passing-through V-groove is an opposite surface of the wafer 1 in FIG. 7(a) and in FIG. 7(b). The passing-through V-groove 21a having a sectional shape of the letter V is formed on a principal surface of the wafer 1 in a planar lattice pattern by an etching process, and has a tapered surface that is the side surface 9a in FIG. 7(a) or the side surface 9b in FIG. 7(b). An isolation layer 4b is formed on the side surface region of the chip by ion injection on the side surface 9a or 9b and followed by activation annealing. The etching process for forming the passing-through V-groove fabricates tapered surfaces of four side surfaces 9a or 9b of the reverse blocking IGBT chip by means of an anisotropic etching process employing an alkali etching solution, which is disclosed in Patent Documents 4, 5, and 6.

The reverse blocking IGBT having a tapered side surface 9b as shown in FIG. 7(b) allows utilizing a wider area in the emitter side, which is the upper surface area in FIG. 7(a) and FIG. 7(b), than the IGBT having a reversely tilted side surface 9a as shown in FIG. 7(a). The IGBT of 7(b) has a wide area available for forming an n type emitter region 15 and a p type base region 16 on the emitter side surface region. Therefore, the configuration of FIG. 7(b) has an advantage that a current density is high or a chip area is reduced for the same current rating. An ion injection process for forming the isolation layer 4b in the reverse blocking IGBT shown in FIG. 7(a) and FIG. 7(b) can be carried out in a much shorter processing time than the diffusion process at a high temperature and for a long time as described previously. Consequently, the type of the IGBT as illustrated in FIGS. 7(a) and 7(b) can solve the problems altogether involved in the method of forming the isolation layer 4 by the high temperature and long time diffusion process including the problems due to lattice defects and oxygeninduced defects and the problem of damage in the diffusion furnace. As compared with the manufacturing method utilizing the vertical trench as described previously, the passing-through V-groove with a low aspect ratio has no problem of a void and a residue in the process of filing the vertical trench with an insulation film. Moreover, the IGBT with the passing-through V-groove exhibits an advantage of easy introduction of dopant by an ion injection process owing to the low aspect ratio of the V-groove.

[Patent Document 1] Japanese Unexamined Patent Application Publication No. H02-022869
[Patent Document 2] Japanese Unexamined Patent Application Publication No. 2001-185727
[Patent Document 3] Japanese Unexamined Patent Application Publication No. 2002-076017
[Patent Document 4] Japanese Unexamined Patent Application Publication No. 2006-156926
[Patent Document 5] Japanese Unexamined Patent Application Publication No. 2004-336008
[Patent Document 6] Japanese Unexamined Patent Application Publication No. 2006-303410

As disclosed in Patent Documents 4 through 6, the long time diffusion process that accompanies the disadvantages described previously can be avoided by employing the method of manufacturing a reverse blocking IGBT comprising an isolation layer formed on the tapered surface of the passing-through V-groove fabricated by an alkali anisotropic etching process. However, since the impurity distribution in the isolation layer formed by ion injection is extremely shallow, if lattice defects formed in the ion injection process are not recovered by an activation annealing process and remained in the isolation layer, the lattice defects, being located in a vicinity of a pn junction in this type of isolation layer, cause large leakage current in a reversely biased condition and a reverse blocking capability is hardly kept. Concerning a laser annealing process employed for recovery of the lattice defects, it has been found that the side surface of the isolation layer is hardly activated sufficiently and the lattice defects are not sufficiently recovered in some cases because the laser irradiation is executed in a short time of several tens of nanoseconds to several microseconds and focusing positions are different between the wafer surface and the side surface of the isolation layer. Due to narrow laser irradiation area, sufficient activation needs scanning of the narrow laser irradiation area over the whole surface of the ion injected layer. The scanning process, however, generates irradiation traces, and may adversely affect the voltage withstanding characteristics.

Another method of manufacturing a reverse blocking IGBT utilizes a tapered surface of a V-groove formed by means of alkali anisotropic etching. The V-groove in this method as shown in FIG. 8 is formed in a non-passing-through configuration with a shallow depth. A p type diffusion layer has been formed from a reversed side surface at an opposite position to the non-passing-through V-groove and exposed to the bottom surface of the V-groove. The double dotted wave-formed curves in FIG. 8 indicate existence of an omitted part in the figure. A reverse blocking IGBT can also be obtained by forming an isolation layer composed of a p type diffusion layer on the tapered surface of the V-groove of a non-passing-through type. This construction relaxes as well the problems accompanied by the diffusion process at a high temperature and for a long time. In addition, this non-passing-through type V-groove has an advantage of omitting the wafer-supporting substrate that is necessary to adhere and hold the chips cut along the passing-through V-grooves together in the reverse blocking IGBT with the passing-through V-groove as shown in FIGS. 7(a) and 7(b).

In the manufacturing process of the non-passing-through type V-grooves, however, an intersecting part is generated where the corner A with a sharp edge meets the bottom surface B of the non-passing-through type V-groove, the bottom surface B being the surface of the thin emitter side silicon, with a certain angle as shown in the perspective view of FIG. 15 illustrating one of the four corners of crossing grooves of the planar lattice pattern in the second principal surface side, that is, the rear surface side. FIG. 16(b) is a sectional view of a reverse blocking IGBT having a recessed part of the groove at the corner. The chip is mounted on a packaging substrate 20 joined with a solder 21 having the recessed edge in the rear surface side positioning in the vertically lower side. Thermal hysteresis subjected to the chip 30b in the soldering process generates thermal stress at the recessed edge part of the chip 30b due to the difference in the thermal expansion coefficients of the two different materials of the reverse blocking IGBT chip 30b and the solder 21. This thermal stress is concentrated around the intersecting parts of A and B. It has been clarified that the strain due to this stress concentration creates a crack at the edge of the chip 30b resulting in degradation of semiconductor characteristics. Even if a crack is not generated in the chip 30b, the passivation film covering the uppermost surface of the chip 30b may be peeled off, resulting in degradation of reliability. FIG. 16(a) is a sectional view of an ordinary IGBT 30a in a state joined on a packaging substrate 20 with a solder 21. This figure is shown for comparison with the construction of FIG. 16(b).

SUMMARY

Additional aspects and/or advantages will be set forth in part in the description which follows and, in part, will be apparent from the description, or may be learned by practice of the invention.

In view of the above-described problems, it is an object of embodiments of the present invention to provide a semiconductor device and a manufacturing method thereof that allows suppressing degradation of semiconductor characteristics due to the stress concentration at the recessed corner part caused by thermal hysteresis in the soldering process, in a semiconductor chip having a recessed part in the non-passing-through type V-groove formed in the semiconductor substrate by an anisotropic etching process.

In order to accomplish objects for embodiments of the present invention, a semiconductor device comprises: a semiconductor substrate of a first conductivity type having a first principal surface and a second principal surface; a diffusion layer of the second conductivity type in a planar lattice pattern on the first principal surface; a V-groove formed on a side of the second principal surface in a planar lattice pattern with the same pitch as that of the planar lattice pattern of the diffusion layer and including a bottom surface parallel to the second principal surface and exposing the diffusion layer, and a tapered side surface rising from the bottom surface; a semiconductor layer of the second conductivity type on the second principal surface surrounded by the tapered side surface; and an isolation layer of the second conductivity type formed on the side surface of the V-groove, the isolation layer electrically connecting the diffusion layer of the second conductivity type on the side of the first principal surface and the semiconductor layer of the second conductivity type on the second principal surface; wherein the V-groove has a chamfered configuration around an intersection between a corner part of the side surface of the V-groove and the bottom surface of the V-groove.

Preferably, the chamfered configuration is a curved surface.

Preferably, the curved surface of the chamfered configuration has a radius of curvature of at least 50 μm.

Preferably, the semiconductor device is a reverse blocking insulated gate bipolar transistor.

Further objects for embodiments of the present invention are accomplished by a method of manufacturing a semiconductor device, the method comprising: a first process or step of forming a diffusion layer of second conductivity type in a planar lattice pattern on a first principal surface of a semiconductor substrate of a first conductivity type, the semiconductor substrate having the first principal surface of an (100) plane and a second principal surface of the (100) plane; a second process or step of forming a V-groove by an anisotropic etching process on the second principal surface in a planar lattice pattern with the same pitch as that of the planar lattice pattern of the diffusion layer, the V-groove comprising a bottom surface parallel to the second principal surface and exposing the diffusion layer of the second conductivity type, and a tapered side surface rising from the bottom surface; a third process or step of chamfering a configuration around an intersection between a corner part of the side surface of the V-groove and the bottom surface of the V-groove by a process selected from a laser irradiation process and an isotropic dry etching process; a fourth process or step of ion injection for forming an isolation layer of the second conductivity type on the side surface of the V-groove, one end of the isolation layer connecting to the diffusion layer of the second conductivity type; a fifth process or step of ion injection for forming a semiconductor layer of the second conductivity type on the second principal surface surrounded by the side surface of the V-groove, the semiconductor layer connecting to the other end of the isolation layer of the second conductivity type on the side surface of the V-groove; and a sixth process or step of annealing for activation after the fourth process or step of ion injection and the fifth process or step of ion injection by at least one annealing process selected from a laser irradiation annealing process, a low temperature annealing process, and a flash lamp annealing process.

Preferably, the fourth process or step of ion injection for forming the isolation layer of the second conductivity type and the fifth process or step of ion injection for forming the semiconductor layer of the second conductivity type are conducted simultaneously, and a single activation process is conducted simultaneously after the simultaneously conducted ion injection process.

Preferably, a single laser irradiation process is conducted simultaneously for an activation process after the fourth process or step of ion injection for forming the isolation layer of the second conductivity type, for an activation process after the fifth process or step of ion injection for forming the semiconductor layer of the second conductivity type, and for the third process or step of chamfering.

In addition to the feature stated just above, it is preferable that a single ion injection process is conducted simultaneously for the fourth process or step of ion injection for forming the isolation layer of the second conductivity type and for the fifth process or step of ion injection for forming the semiconductor layer of the second conductivity type.

Embodiments of the present invention provide a semiconductor device and a manufacturing method thereof that allow suppressing degradation of semiconductor characteristics due to the stress concentration at the recessed corner part caused by thermal hysteresis in the soldering process, in a semiconductor chip having a recessed part in the non-passing-through type V-groove formed in the semiconductor substrate by an anisotropic etching process.

BRIEF DESCRIPTION OF THE DRAWINGS

These and/or other aspects and advantages will become apparent and more readily appreciated from the following description of the embodiments, taken in conjunction with the accompanying drawings of which:

FIGS. 16(a) and 16(b) are sectional views of an essential part of a reverse blocking IGBT chip mounted on a packaging substrate, in which FIG. 16(a) shows an ordinary IGBT chip mounted on the packaging substrate and FIG. 16(b) shows a reverse blocking IGBT chip having a recessed part formed of a non-passing-through V-groove;

FIGS. 18(a) and 18(b) are sectional views of an essential part of a semiconductor substrate having a non-passing-through V-groove, in which FIG. 18(a) shows a conventional non-passing-through type V-groove without chamfering and FIG. 18(b) shows a non-passing-through type V-groove chamfered according to embodiments of the present invention.

DESCRIPTION OF SYMBOLS

Figure 1A:
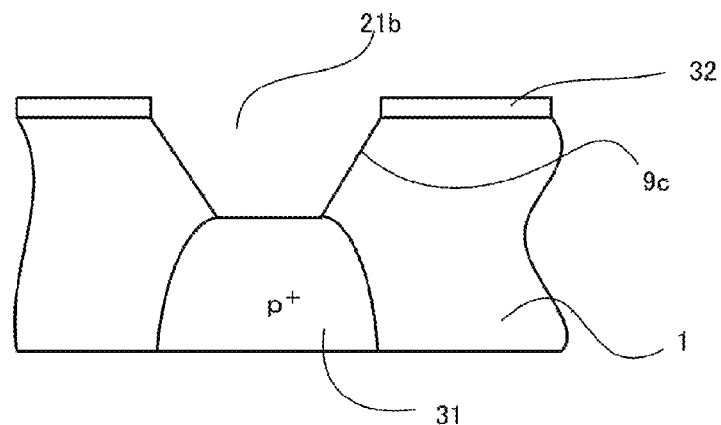
FIGS. 1(a), 1(b), and 1(c) are sectional views of an essential part of a semiconductor substrate showing a method of forming an isolation layer in Example 1 of an embodiment according to the present invention.

1: wafer
2: oxide film
3: opening
4: p type diffusion layer
4a, 4b: isolation layer
6: p type collector layer
7: collector electrode
10: MOS gate structure
15: n type emitter region
16: p type base region
17: gate electrode
18: emitter electrode
19: insulation film
20: packaging substrate
21: solder
21a: passing-through V-groove
21b: non-passing-through V-groove
23: (100) plane
30b: reverse blocking IGBT chip
31: p type diffusion layer
32: resist mask
33: collector pn junction

DESCRIPTION OF EMBODIMENTS

Reference will now be made in detail to the embodiments, examples of which are illustrated in the accompanying drawings, wherein like reference numerals refer to the like elements throughout. The embodiments are described below to explain the present invention by referring to the figures.

Embodiments according to the present invention of a semiconductor device, in particular a reverse blocking IGBT, and a manufacturing method thereof are described in detail in the following with reference to accompanying drawings. The present invention is, however, not limited to the embodiment examples described in the following, but applicable to any other device and method as long as they do not exceed the spirit and scope of the invention. In the following description, the first conductivity type is the n type and the second conductivity type is the p type. In the case of a semiconductor device of an IGBT, the first principal surface is the emitter side surface or the front surface of the IGBT and the second principal surface is the collector side surface or the rear surface of the IGBT.

Some preferred embodiments according to the present invention are described in the following on a reverse blocking IGBT of a nominal breakdown voltage of 600 V. The reverse blocking IGBT comprises a p type diffusion layer about 120 μm deep in a planar lattice pattern on a first principal surface of a (100) plane, or a front surface, of an FZ-n type silicon semiconductor substrate 1. A semiconductor element region is provided in each square region in the planar lattice pattern. The semiconductor element region includes a MOS gate structure and a voltage withstanding structure composing a front surface side construction of a reverse blocking IGBT. On the second principal surface side, or a rear surface side, a non-passing-through type V-groove is formed opposing the p type diffusion layer by an alkali anisotropic etching process. The non-passing-through type V-groove has a bottom surface parallel to the second principal surface. The bottom surface of the non-passing-through type V-groove is an exposing bottom surface of the p type diffusion layer formed from the first principal surface side. The non-passing-through type V-groove is formed in a planar lattice pattern on the second principal surface of the wafer that is similar to a planar lattice pattern of the p type diffusion layer on the first principal surface of the wafer. The planar lattice pattern of the non-passing-through type V-groove and the planar lattice pattern of the p type diffusion layer have the same pitches and are disposed opposing to each other. Thus, reverse blocking IGBT chips are extracted by dicing the wafer along center lines between the square regions in the planar lattice pattern. The non-passing-through type V-groove has a bottom surface at a depth of about 80 μm and tapered side surfaces rising up from the bottom surface to the second principal surface or the rear surface. A p type collector layer that is a second conductivity type semiconductor layer is provided on the second principal surface surrounded by the tapered side surfaces. A p type isolation layer is provided along the side surface, the isolation layer electrically connecting the p type diffusion layer in the first principal surface side to the p type collector layer on the second principal surface. A reverse blocking IGBT of embodiments of the present invention is featured by a chamfered configuration around the position where the corner part of intersecting side surfaces meets the bottom surface of the V-groove.

EXAMPLE 1

Example 1 of an embodiment according to the invention is described in detail in the following focusing on the features in Example 1. In the first process or step, a p type diffusion layer with a depth of about 120 μm and a width of about 200 μm is formed in a planar lattice pattern on the first principal surface of an n type wafer. A high temperature thermal diffusion process to a relatively shallow depth of about 120 μm considerably relaxes the problem in the high temperature thermal diffusion at 1,300° C. for 200 hr that is necessary for thermal diffusion to a depth of several hundred μm as described previously concerning a conventional semiconductor device. Thus, the problem is insignificant in a thermal diffusion process in embodiments of the invention.

A MOS gate structure is formed on the surface region of the (100) plane of the wafer surrounded by the p type diffusion layer. The MOS gate structure comprises: a p type base region, an n type emitter region formed on the surface region of the p type base region, and a gate electrode formed, interposing a gate insulation film, on a surface of a part of the p type base region that lies between the n type emitter region and a surface region of the n type wafer. After covering the gate electrode with an interlayer dielectric film, an emitter electrode mainly composed of aluminum is formed by a well known fabrication technique. Then, the second principal surface of the wafer is ground to a wafer thickness of 180 μm. If the wafer process starts using a wafer having a thickness of 180 μm, this process or step of back grinding is unnecessary to decrease the wafer thickness.

In the second process or step, a non-passing-through type V-groove 80 μm deep is formed from the second principal surface of the wafer with a thickness of 180 μm, in a planar lattice pattern with the same pitch as in the planar lattice pattern of the p type diffusion layer on the first principal surface. The non-passing-through type V-groove is obtained, using a mask of a thermal oxidation film formed on the second principal surface, by etching the (100) plane of the wafer exposing at the opening of the mask using a 5% solution of TMAH (tetramethyl ammonium hydroxide) at 80° C. for 2 hr and 40 min. As a result, in the second principal surface region of the wafer, a non-passing-through type V-groove is formed with a trapezoidal cross-section, which is widest at the superficial position of the rear surface side and gradually becomes narrower as descending deeper. Side walls with {111} planes that constitute four side surfaces of a semiconductor chip are formed on the inside surface of the non-passing-through type V-groove. In the case of a width of the opening of the non-passing-through type V-groove of 150 μm at the superficial position, the bottom surface of the non-passing-through type V-groove is an (100) plane with a width of 36 μm and positions at a depth of 80 μm. At the bottom surface of (100) plane of the obtained non-passing-through type V-groove, the bottom portion of the p type diffusion layer formed from the emitter side in the first principal surface side is exposed.

A non-passing-through type V-groove similar to the one described above can be formed by using an etching solution of mixed liquids of potassium hydroxide 21:isopropyl alcohol 8:water 71, as well as the aqueous solution of TMAH described above, held at a constant temperature in the range of 50° C. to 70° C. Another aqueous solution containing hydrazine or ethylene diamine, for example, can be used as well for the etching solution.

Figure 18A:
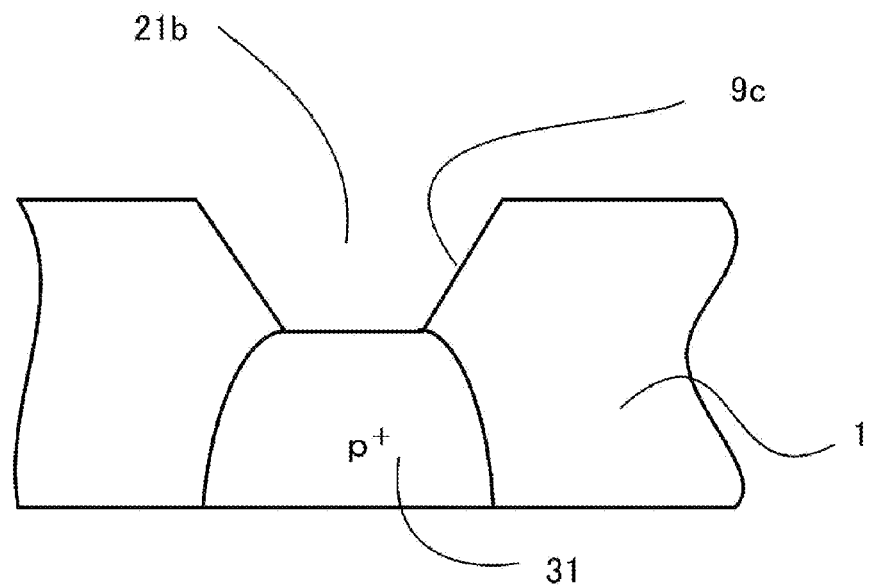
Figure 18B:
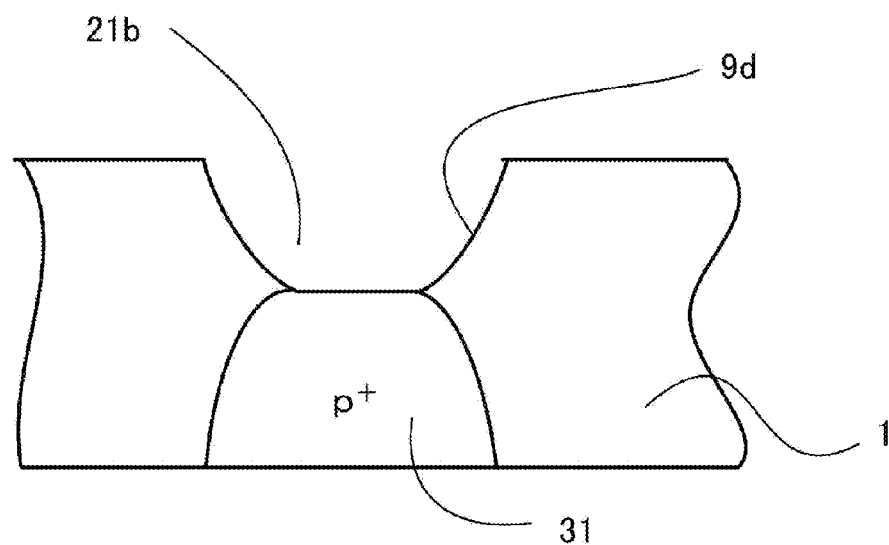

In the etching solution mentioned previously, the etching speed for the (100) plane is about 100 times faster than the one for the (111) plane. Consequently, a continued etching process eventually eliminates the (100) plane at the bottom surface and stops to etch at that time, leaving a V-shaped groove with side surfaces, or side walls, of {111} planes that are equivalent to the (111) plane. Utilizing this difference in the etching speeds of the etching solution for the (100) plane and for the (111) plane, it is actually possible to control a depth of the V-groove depending on an opening width of the etching mask. The angle between the (100) plane and the (111) plane is 54.7° in the wafer of Example 1, and the etching process for a width of the opening of 150 μm is stopped at a depth of the V-groove of about 80 μm. FIG. 18($a$) is a sectional view of a wafer 1 in which a non-passing-through type V-groove 21$b$ is formed having a tapered side surface 9$c$ and a bottom surface that is an exposing bottom part of the p type diffusion layer 31 formed from the front surface side.

The etching method for forming the non-passing-through type V-groove as described above is an alkali anisotropic etching process. The non-passing-through type V-groove can also be formed using a dicing blade having a tip shape of the letter V or a trapezoid. When an isotropic dry etching process is executed after forming the non-passing-through type V-groove using the dicing blade, strain in the surface region generated by the blade can be eliminated and simultaneously, chamfering of the four corners can also be performed. This isotropic dry etching process can be an alternative way of chamfering in the third process or step according to the manufacturing method for embodiments of the invention.

FIG. 18($b$) shows a non-passing-through type V-groove 21$b$ having tapered side surfaces 9$d$ with the lower part of the corner rounded, which is formed in the third process or step of the manufacturing method according to embodiments of the invention as described in the following.

FIGS. 1($a$), 1($b$) and 1($c$) show a process for fabricating the non-passing-through type V-groove 21$b$ having a rounded lower part of the corner as shown in FIG. 18($b$) after forming the non-passing-through type V-groove 21$b$ having tapered side surfaces 9$c$ as shown in the sectional view of FIG. 18($a$).

First, a resist mask 32 with a thickness of 0.5 μm to 5 μm is formed on the second principal surface, the collector side surface, of the wafer 1 where a non-passing-through type V-groove 21$b$ has been formed, as shown in FIG. 1($a$). Then, laser irradiation is conducted towards the bottom surface of the non-passing-through type V-groove as shown by the arrows in FIG. 1($b$). The laser irradiation is executed perpendicularly to the second principal surface, a collector side surface, with an energy density of 4 J/cm$^2$ using a laser emission device of YAG 2ω laser at a wavelength of 532 nm and with a half width of 100 ns. The collector side surface positioning at a level of the top of the side surface 9$c$ shown in FIG. 1($a$) is masked by the resist mask 32 and not irradiated by the laser light. The resist mask in the laser irradiation process can be one and the same resist mask 32 that has been used in the etching process with TMAH for forming the non-passing-through type V-groove 21$b$. When an oxide film has been used for an etching mask, a resist mask is newly formed for the laser irradiation process. This laser irradiation process in the third process or step of a manufacturing method according to embodiments of the invention forms a side surface 9$d$ having a corner part that is chamfered with a radius of curvature R of at least 50 μm as shown in FIG. 1($b$) and FIG. 18($b$). Although the side surfaces are laser irradiated as well, the effect of chamfering is relatively small because the energy density per unit area is small due to the inclination of the side surface. The lower portion of the side surface in the vicinity of the bottom surface, on the other hand, partially melts in the surface region thereof owing to a relatively large irradiation energy performing effective chamfering to a rounded configuration. Although a resist mask is used for the laser irradiation in this example, a hard mask of a metallic material can be used as well.

Subsequently, boron ion injection is conducted on the side surface using this resist mask 32 as shown in FIG. 1($c$), under the condition of a dose amount of 1×10$^{15}$ atoms/cm$^2$ at 45 keV. This ion injection process can be carried out with an incidence perpendicular to the surface of the semiconductor substrate without tilting the wafer owing to tilting angle of the side surface 9$d$ of the non-passing-through type V-groove 21$b$ of about 125° as shown in FIG. 1($c$), although it is possible to inject into the side wall tilting the semiconductor substrate as in the case of the injection into an ordinary vertical trench having a vertical side wall. As a result of the ion injection, a boron ion injection layer is formed on the side surface 9$d$ of the non-passing-through type V-groove 21$b$, the boron ion injection layer being connected at an end thereof to the p type diffusion layer 31 that has been formed in the first process or step. This ion injection process is a fourth process or step in the manufacturing method according to embodiments of the invention. Subsequently, a laser irradiation process is conducted with YAG 2ω laser at a wavelength of 532 nm and a half width of 100 ns at an irradiation energy density of 4 J/cm$^2$. This laser irradiation process, or a laser annealing process, activates the ion injection layer on the side surface 9$d$ and forms an isolation layer 4b composed of a p type diffusion layer. This laser irradiation process is a type of annealing of a sixth process or step in the manufacturing method according to embodiments of the invention.

Figure 19:
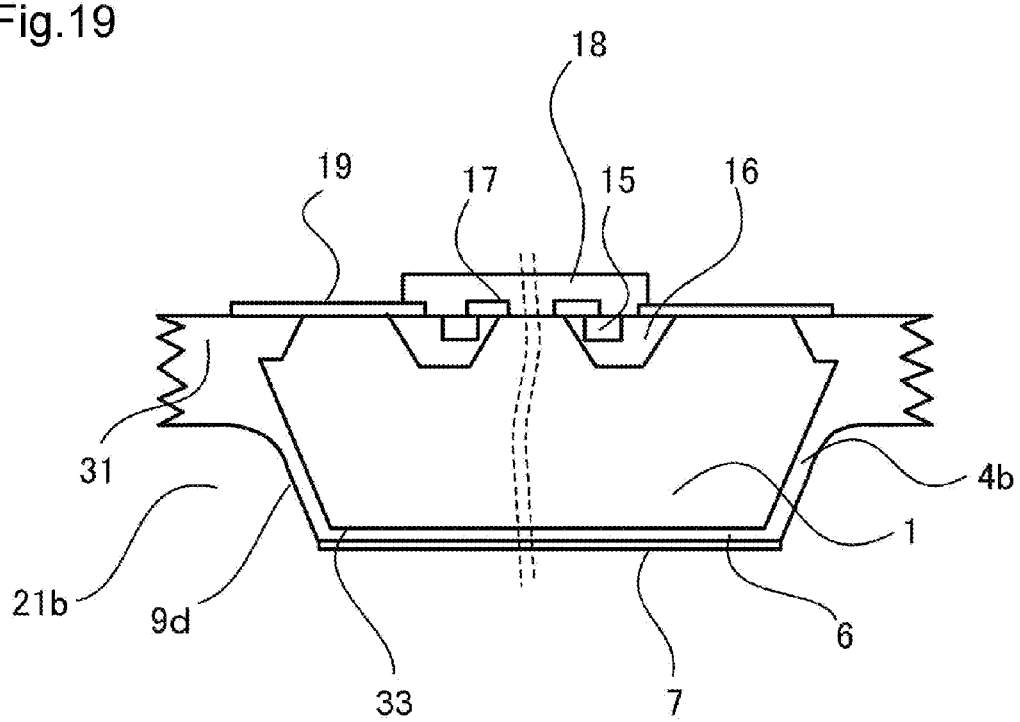
FIG. 19 is a sectional view of a reverse blocking IGBT chip having a non-passing-through type V-groove chamfered according to embodiments of the present invention.

FIG. 19 is a sectional view of a reverse blocking IGBT of Example 1. A boron injection layer is formed by boron ion injection while masking the non-passing-through type V-groove by a newly prepared resist mask (not shown in the figure). This boron injection layer covers a planar surface surrounded by the non-passing-through type V-groove and is connecting to the isolation layer 4b. This boron injection process is a fifth process or step in the manufacturing method according to embodiments of the invention. Then, a laser irradiation process is conducted again with YAG 2ω laser at a wavelength of 532 nm and a half width of 100 ns at an irradiation energy density of 4 J/cm$^2$. This laser irradiation process, or a laser annealing process, activates the ion injection layer on the rear side surface and forms a p type collector layer 6 composed of a p type diffusion layer. This laser irradiation process is a type of annealing of a sixth process or step in the manufacturing method according to embodiments of the invention. The double dotted lines in FIG. 19 indicate existence of an omitted portion in the figure.

The isolation layer 4b, which is a p type diffusion layer formed on the side surface 9d of the non-passing-through type V-groove 21b, is connected to the p type diffusion layer 31 formed from the first principal surface side at one end of the isolation layer 4b in the bottom surface of the non-passing-through type V-groove 21b. The other end of the isolation layer 4b is connected to the p type collector layer 6 formed on the collector surface in the second principal surface side. As a result, a region of the same conductivity type, a p type region, exists continuously from the first principal surface to the second principal surface of the semiconductor substrate. Consequently, the isolation layer 4b shifts the end plane of the collector pn junction 33 towards the first principal surface side, the front surface side, of the wafer. The end plane of the collector pn junction 33 exposed to the front surface is protected by the insulation film 19 as shown in FIG. 19.

Finally, a collector electrode 7 is laminated of Ti, Ni, Au and the like on the p type collector layer 6 on the second principal surface. Thus, a reverse blocking IGBT according to embodiments of the invention as shown in FIG. 19 is completed.

The reverse blocking IGBT having a non-passing-through type V-groove of Example 1 according to embodiments of the present invention described thus far allows relaxation of stress concentration at the four corners of the non-passing-through V-groove in the thin part of the substrate, the stress concentration being liable to occur due to thermal hysteresis subjected by soldering in an assembling process. Consequently, the device and method of Example 1 according to embodiments of the invention avoid troubles such as a crack, break, and deterioration of semiconductor characteristics of the chip due to the stress concentration.

EXAMPLE 2

Example 2 according to embodiments of the present invention is described in the following focusing on the features of the embodiment example.

A non-passing-through V-groove 21b is formed in the same manner as in Example 1. A chamfering process is executed around the bottom part of the side surface 9c of the non-passing-through V-groove 21b by laser irradiation. Then, processes of ion injection and activation are conducted. The activation process in Example 2 is carried out, different from the laser annealing process in Example 1, by a low temperature annealing process, the 'annealing' meaning 'activation' in the following description. The ion injection process injects boron ions under a condition of a dose amount of 1×10$^{14}$/cm$^2$ at 50 keV. The annealing process is conducted in a low temperature furnace at 380° C for 1 hr. The temperature 380° C is decided for avoiding a temperature of about 450µC at which oxygen becomes a donor, deteriorating device characteristics.

Figure 9:
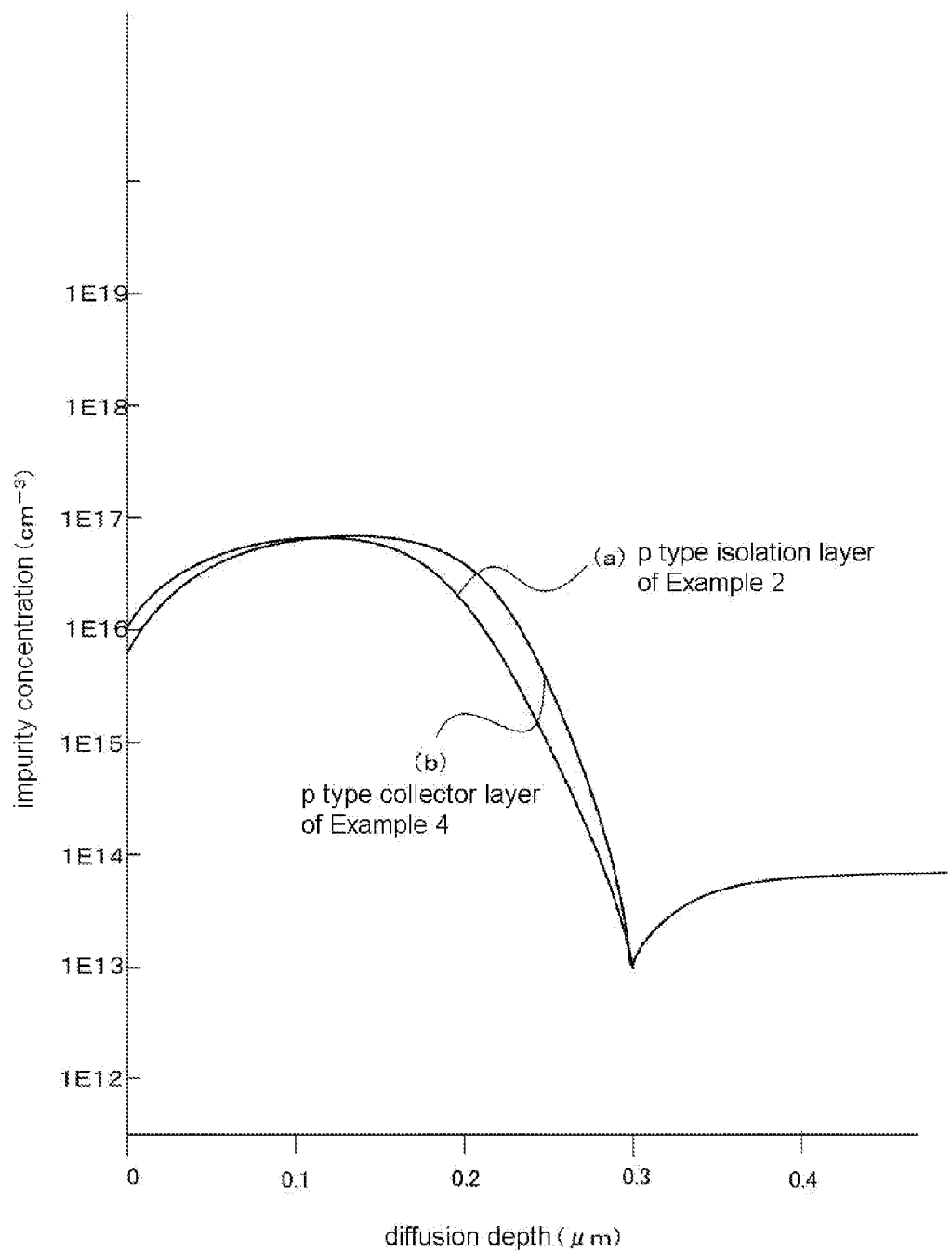
FIG. 9 shows impurity concentration profiles of an isolation layer and a collector layer obtained by an SR measurement for the case of low temperature annealing according to embodiments of the present invention.

The curve (a) of FIG. 9 shows an impurity concentration profile, obtained by SR measurement (measurement by the spreading resistance probe method), of the p type isolation layer on the side surface 9d of the non-passing-through V-groove 21b after the processes of ion injection and annealing. Although the activation rate of the boron ion injection layer is a low value of about 1%, an IGBT exhibiting a reverse blocking performance is obtained.

The reverse blocking IGBT having a non-passing-through V-groove of Example 2 according to embodiments of the present invention described above allows relaxation of stress concentration at the four corners of the non-passing-through V-groove in the thin part of the substrate, the stress concentration being liable to occur due to thermal hysteresis subjected by soldering in an assembling process. Consequently, the device and method of Example 2 according to embodiments of the invention avoid troubles such as a crack, break, and deterioration of semiconductor characteristics of the chip due to the stress concentration.

EXAMPLE 3

Example 3 according to embodiments of the present invention is described in the following focusing on the features of the embodiment example.

Figure 1B:
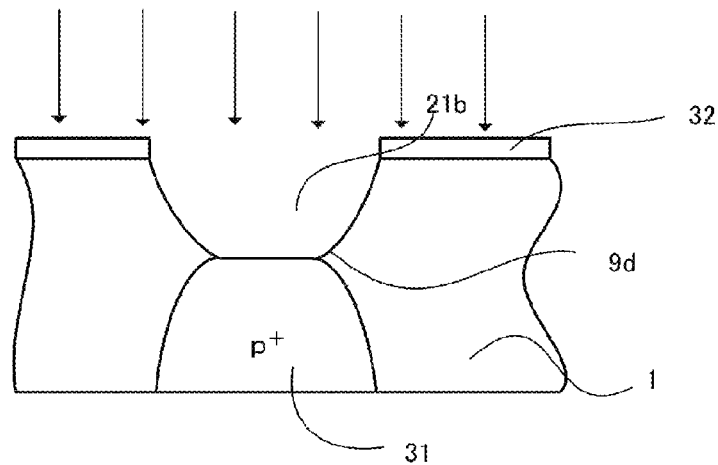
Figure 1C:
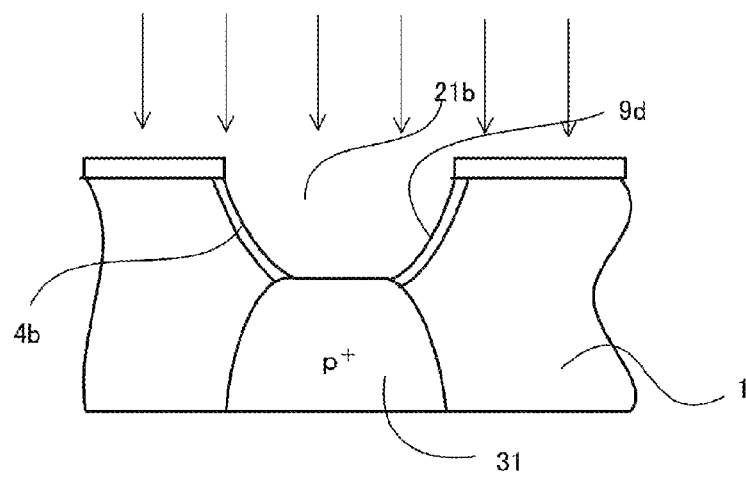
Figure 2A:
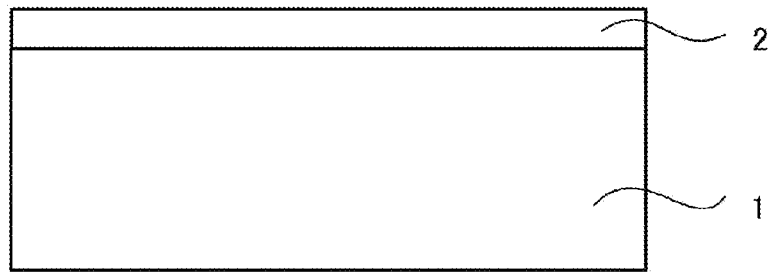
FIGS. 2(a), 2(b), and 2(c) are sectional views of an essential part of a semiconductor substrate showing a conventional method of forming an isolation layer by an application and diffusion technique.
Figure 2B:
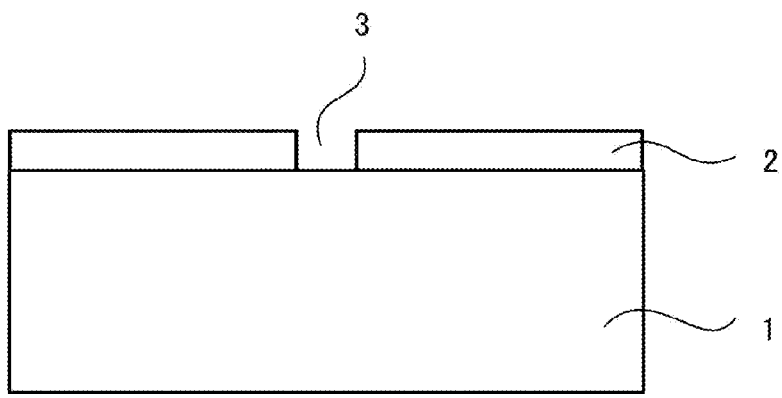
Figure 2C:
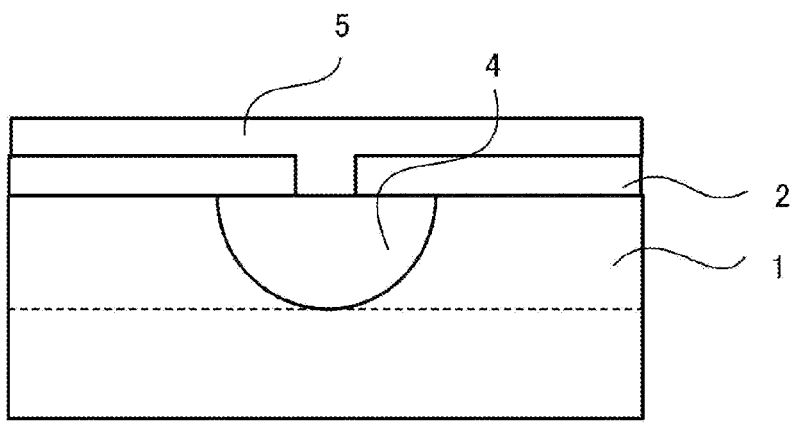
Figure 3:
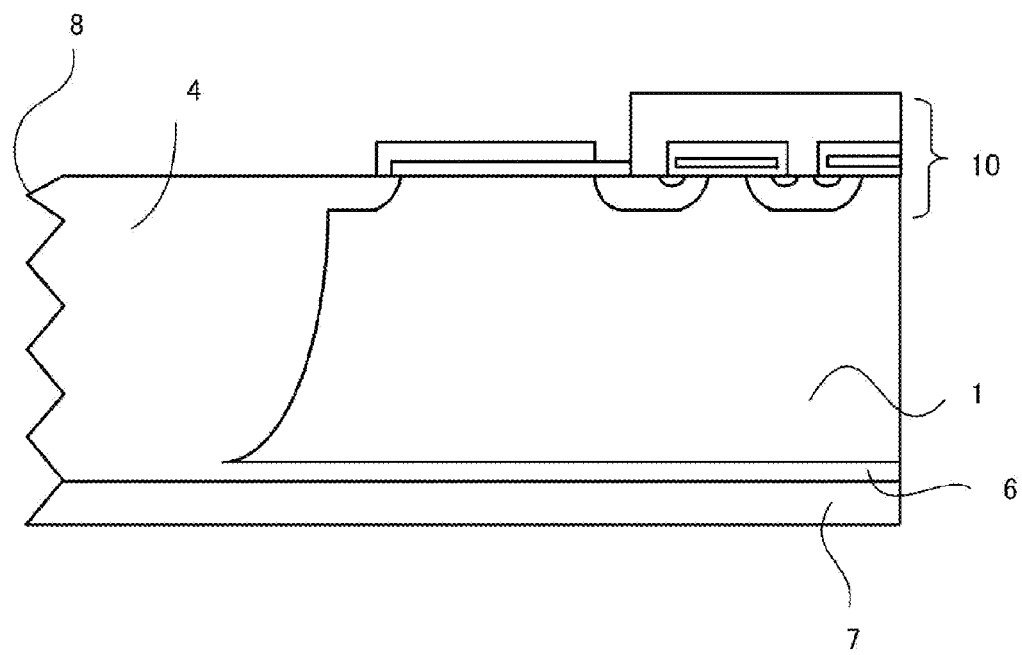
FIG. 3 is a sectional view of a part around an edge of a conventional reverse blocking IGBT having an isolation layer formed by the application and diffusion technique.
Figure 4A:
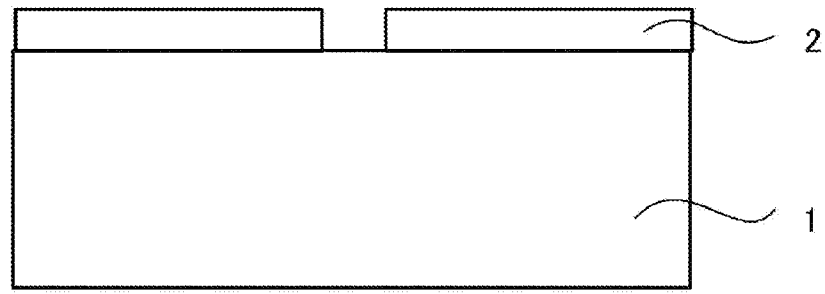
FIGS. 4(a), 4(b), and 4(c) are sectional views of an essential part of a semiconductor substrate showing a conventional method of forming an isolation layer utilizing a vertical trench.
Figure 4B:
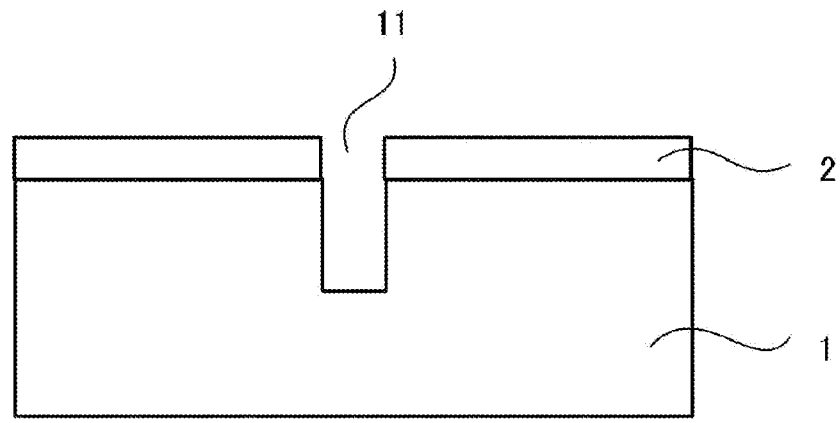
Figure 4C:
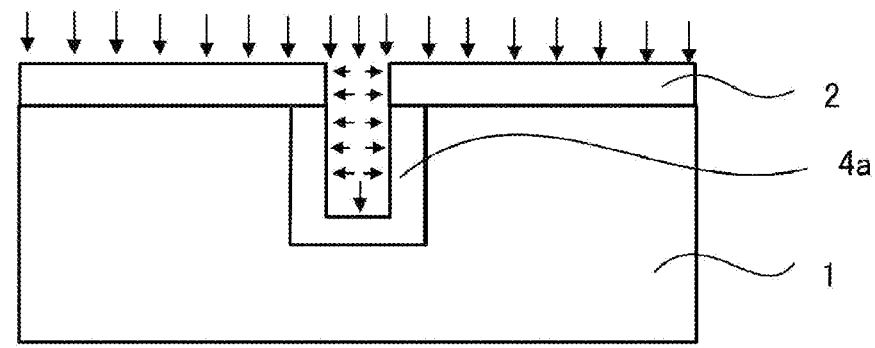
Figure 5:
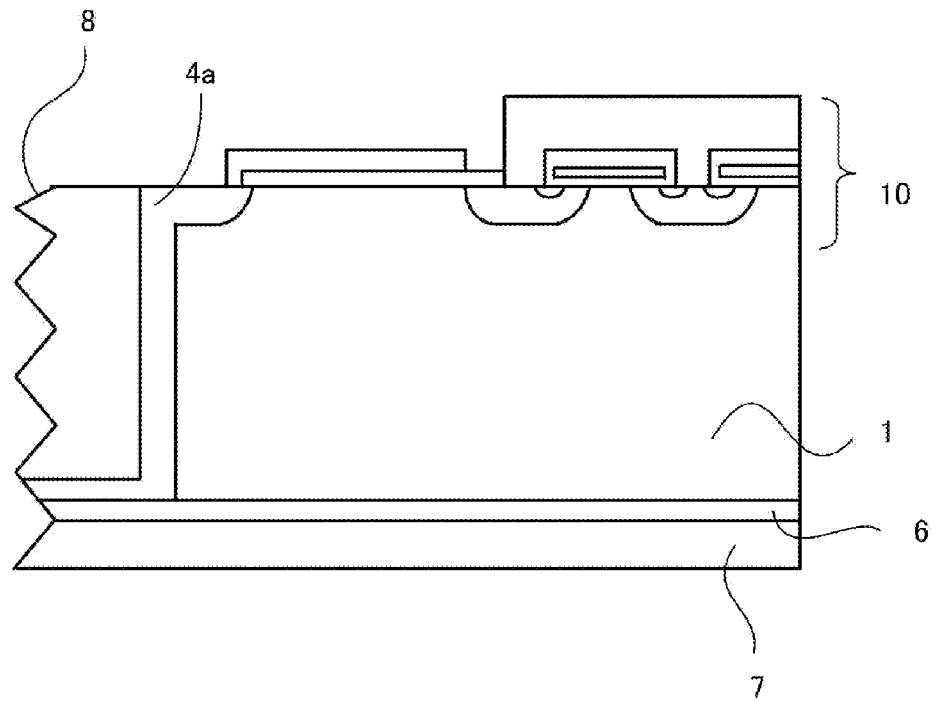
FIG. 5 is a sectional view of a part around the edge of a conventional reverse blocking IGBT having an isolation layer utilizing a vertical trench.
Figure 6:
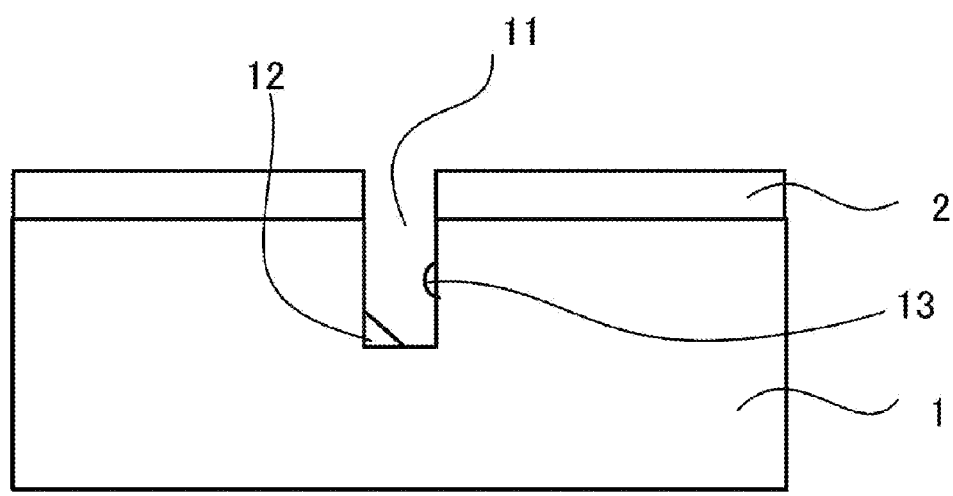
FIG. 6 is a sectional view of an essential part of a conventional semiconductor substrate showing problems in the process of forming an isolation layer utilizing a vertical trench.
Figure 7A:
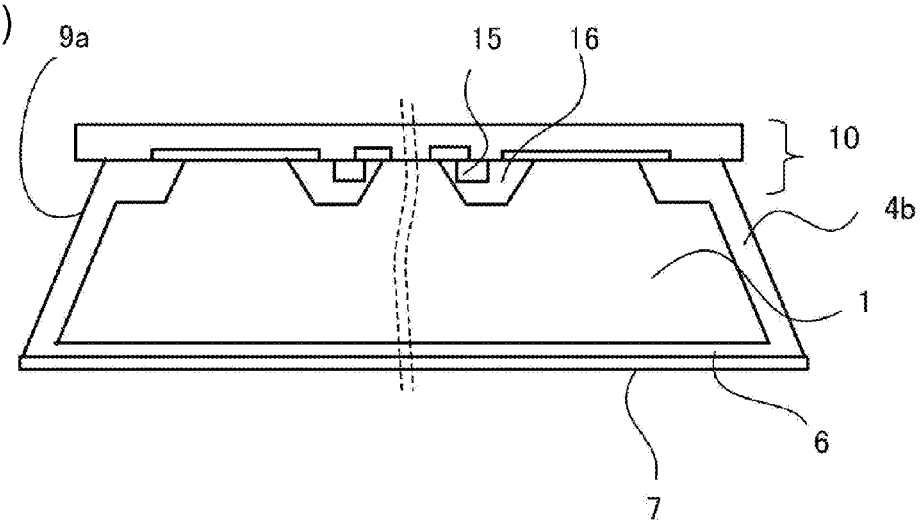
FIGS. 7(a) and 7(b) are sectional views of an essential part of a conventional reverse blocking IGBT having an isolation layer formed on a passing-through V-groove.
Figure 7B:
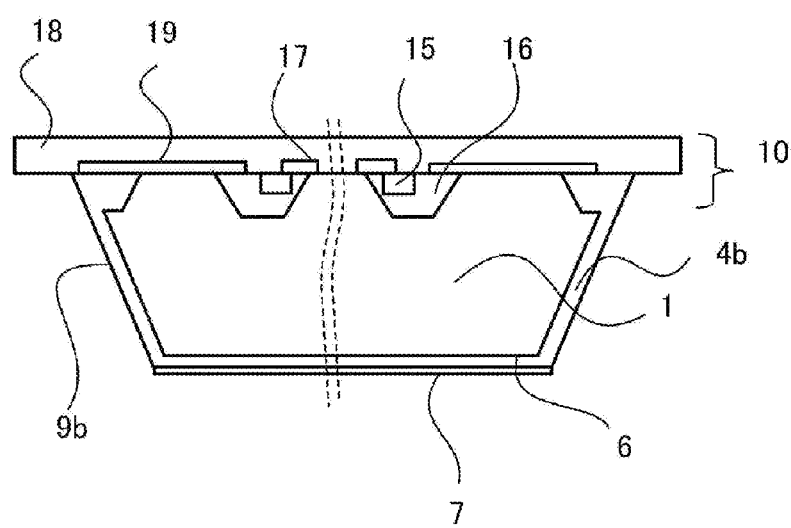
Figure 8:
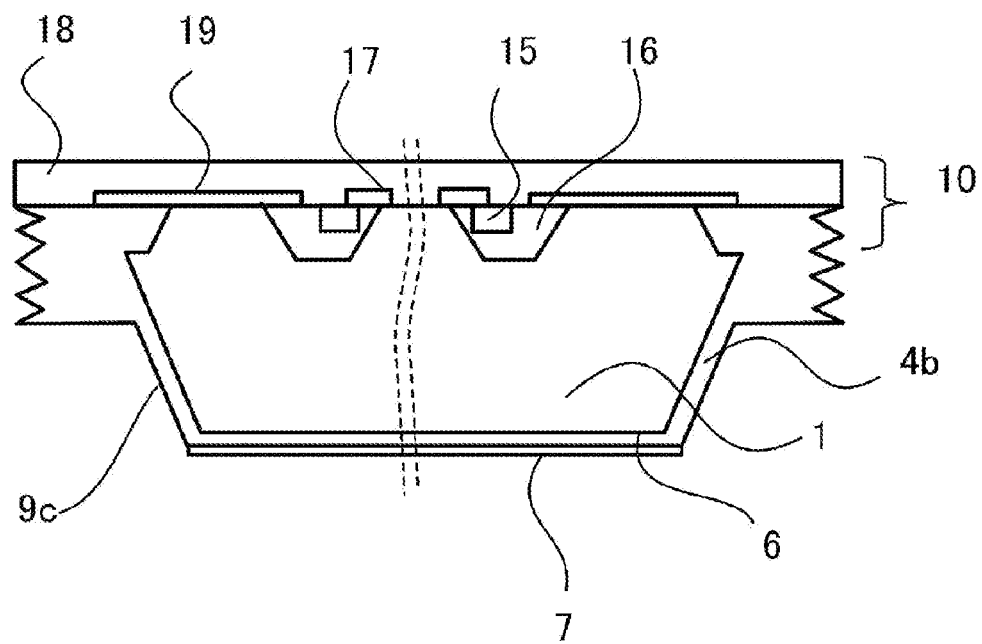
FIG. 8 is a sectional view of an essential part of a conventional IGBT having an isolation layer formed on a non-passing-through V-groove.
Figure 10:
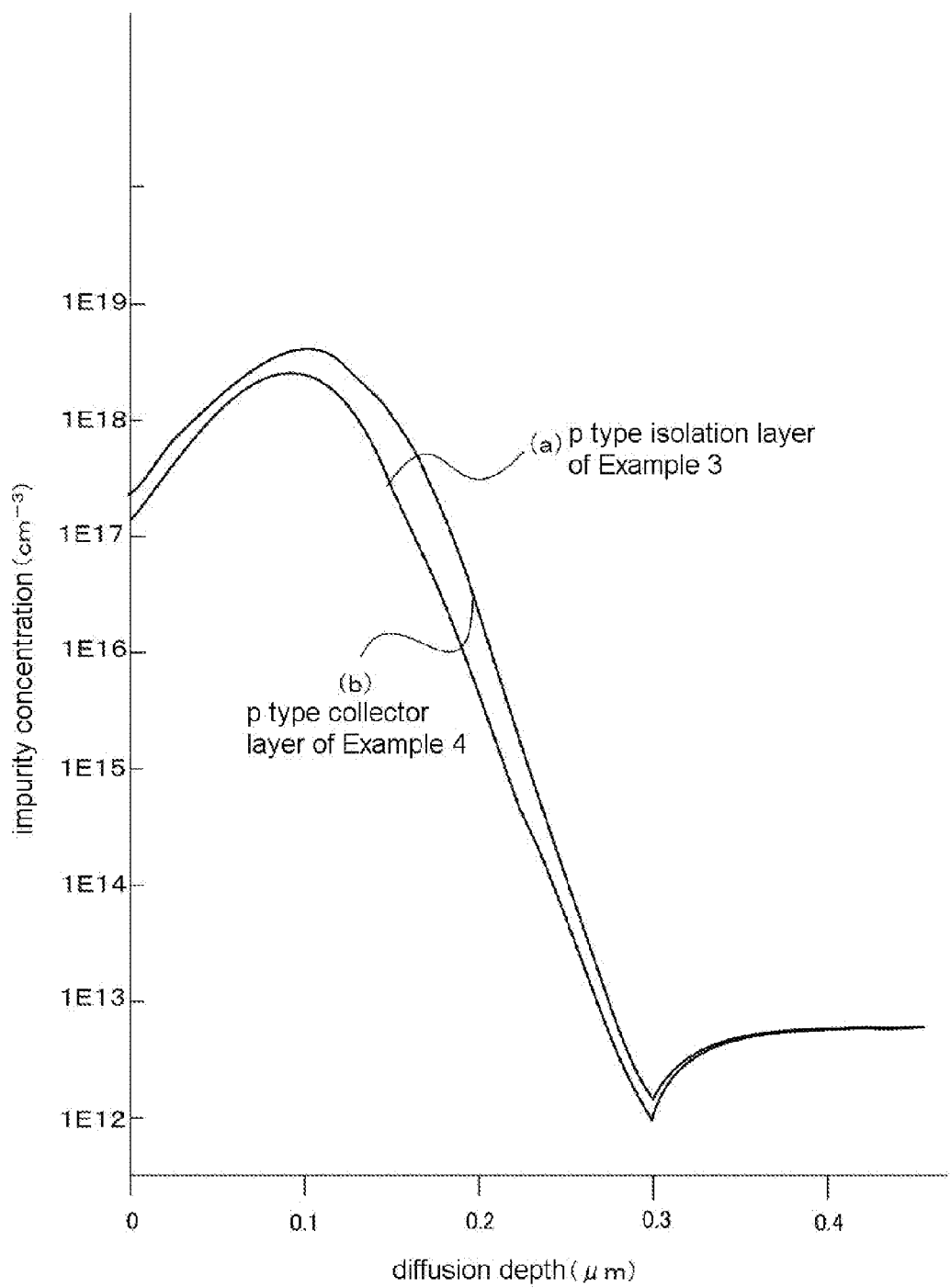
FIG. 10 shows impurity concentration profiles of an isolation layer and a collector layer obtained by an SR measurement for the case of flash lamp annealing according to embodiments of the present invention.

A non-passing-through V-groove 21b is formed in the same manner as in Example 1. A chamfering process is executed around the bottom part of the side surface 9c of the non-passing-through V-groove 21b by laser irradiation. Then, a process of boron ion injection is conducted into the side surface 9d of the non-passing-through V-groove to form an ion injection layer for forming an isolation layer as shown in FIGS. 1(a), 1(b) and 1(c). In Example 3, the ion injection layer is activated to create the isolation layer 4b by a flash lamp annealing process, which is different from the annealing processes in Example 1 and Example 2. The ion injection process injects boron ions under a condition of a dose amount of 1×10$^{14}$/cm$^2$ at 50 keV. The flash lamp annealing process is conducted after preliminarily heating the wafer to an elevated temperature of 300° C., at which the effect of donorization of oxygen is negligible, and then by irradiation at an energy density of 30 J/cm$^2$. The curve (a) of FIG. 10 shows an impurity concentration profile, obtained by SR measurement, of the p type isolation layer on the side surface 9d of the non-passing-through V-groove 21b after the processes of ion injection and annealing. The activation rate of the boron ion injection layer is about 40%, and an element exhibiting a reverse blocking performance is obtained.

The reverse blocking IGBT having a non-passing-through V-groove of Example 3 according to embodiments of the present invention described above allows relaxation of stress concentration at the four corners of the non-passing-through V-groove in thin part of the substrate, the stress concentration being liable to occur due to thermal hysteresis subjected by soldering in an assembling process. Consequently, the device and method of Example 3 according to embodiments of the invention avoid troubles such as a crack, break, and deterioration of semiconductor characteristics of the chip due to the stress concentration.

EXAMPLE 4

Example 4 according to embodiments of the present invention is described in the following focusing on the features of the embodiment example.

Figure 11:
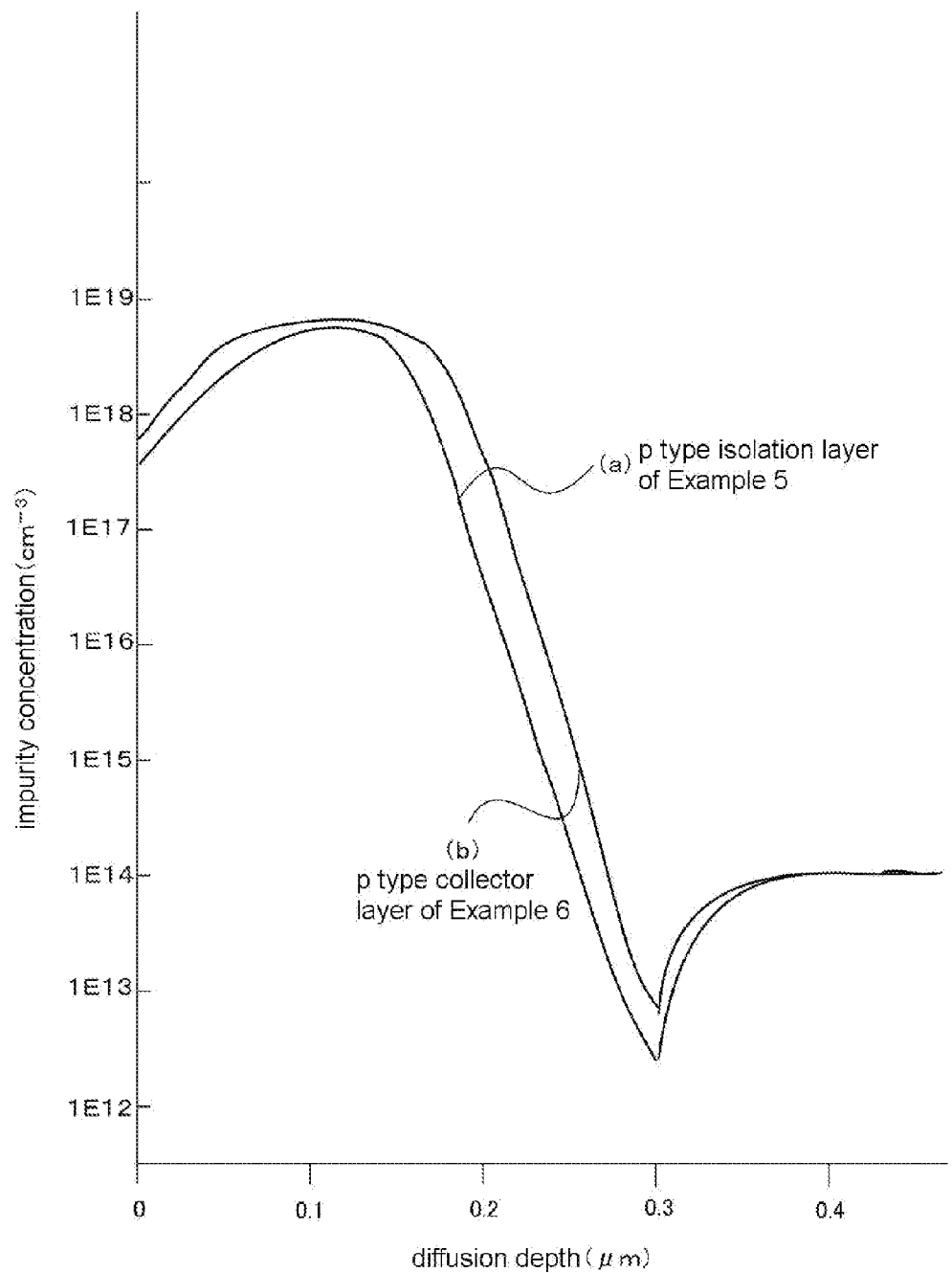
FIG. 11 shows impurity concentration profiles of an isolation layer and a collector layer obtained by an SR measurement for the case of laser annealing according to embodiments of the present invention.

In Example 4, the ion injection layer for forming the isolation layer on the side surface and the ion injection layer for forming the p type collector layer on the rear surface are formed simultaneously. These two layers are formed separately in Examples 2 and 3. Then, the ion injection layer for forming the isolation layer and the ion injection layer for forming the p type collector layer on the rear surface are simultaneously annealed in a low temperature furnace. The ion injection process is conducted for both of the isolation layer on the side surface of the non-passing-through V-groove and the p type collector layer on the rear surface by injecting boron ions in a dose amount of $1\times10^{14}/cm^2$ at 50 keV. The low temperature furnace annealing is conducted at a temperature of 380° C. for 1 hr. The curve (b) of FIG. 9 shows an impurity concentration profile, obtained by the SR measurement, of the p type collector layer on the rear surface after the annealing process. Although the activation rate of the boron ion injection layer is a low value of about 1.3%, an element exhibiting a reverse blocking performance is obtained. The concentration distribution in the p type collector layer on the rear surface is deeper, which means a diffusion depth is deeper in that layer, than the one in the isolation layer on the side surface of the non-passing-through V-groove. The reason for this result is that the amount of dopant injected into the side surface is relatively small because the ions are injected to a slanted surface of the side surface. In FIG. 10 and FIG. 11, the diffusion depth is likewise deeper in the collector layer on the rear surface for the same reason.

The simultaneous activation process can be carried out by flash lamp annealing instead of the low temperature furnace annealing. The ion injection process injects boron ions under a condition of a dose amount of $1\times10^{14}/cm^2$ at 50 keV. Then, a flash lamp annealing process is conducted at an energy density of $30 J/cm^2$. The curve (b) of FIG. 10 shows an impurity concentration profile, obtained by SR measurement, of the p type collector layer on the rear surface. The activation rate of the boron ion injection layer is about 40% and an element exhibiting a reverse blocking performance is obtained.

In Example 4 according to embodiments of the invention, the isolation layer on the side surface of the non-passing-through V-groove and the p type collector layer on the rear surface do not need to be formed in separate processes. The stress concentration at the lower part of the corner is suppressed in Example 4 as well as in other Examples described above. Therefore, an element is obtained without a crack and a break of the chip due to the stress concentration.

EXAMPLE 5

Example 5 according to embodiments of the present invention is described in the following focusing on the features of the embodiment example. A non-passing-through V-groove is formed by an alkali anisotropic etching process in Example 5. A chamfering process by laser irradiation is not conducted immediately after the etching process. Instead, a boron ion injection process is conducted on the side surface of the non-passing-through V-groove before the chamfering process. After that, a process is conducted for activating the ion injection layer formed on the side surface of the non-passing-through V-groove by laser irradiation to form the isolation layer and simultaneously for chamfering the bottom part of the corner of the non-passing-through V-groove. The ion injection process injects boron ions under a condition of a dose amount of $1\times10^{14}/cm^2$ at 50 keV. The laser annealing is conducted under the conditions of YAG 2ω laser at a wavelength of 532 nm and a half width of 100 ns at an irradiation energy density of $4 J/cm^2$. The curve (a) of FIG. 11 shows an impurity concentration profile, obtained by the SR measurement, of the p type isolation layer on the side surface of the non-passing-through V-groove 21b after the process of annealing and chamfering by the laser irradiation. The activation rate of the p type isolation layer is about 50%, and an element exhibiting a reverse blocking performance is obtained. This laser irradiation process forms a non-passing-through V-groove including a bottom part of the corner with a chamfered configuration of a radius of curvature R of at least 50 μm.

Figure 13A:
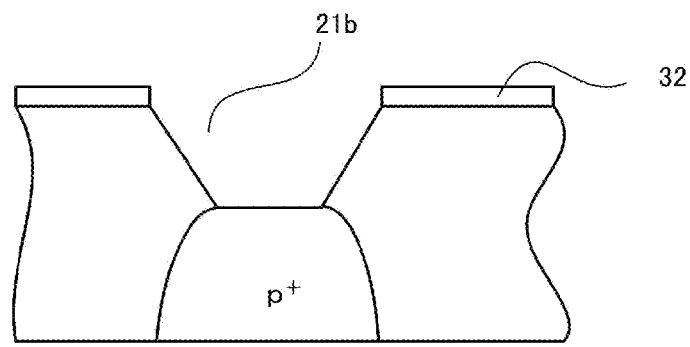
FIG. 13(a) through 13(d) are sectional views of an essential part showing processes or steps of fabricating a non-passing-through type V-groove and an isolation layer in Example 5 of an embodiment according to the present invention.
Figure 13B:
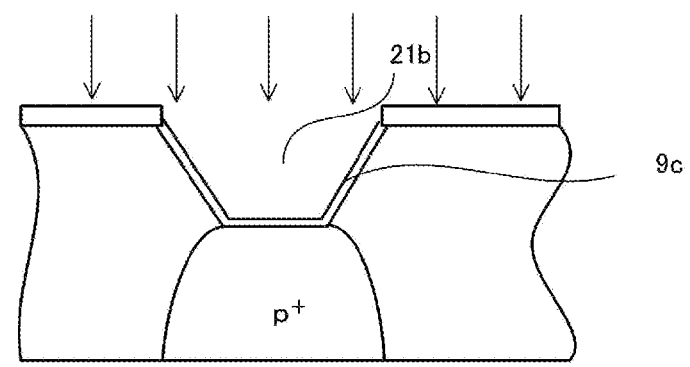
Figure 13C:
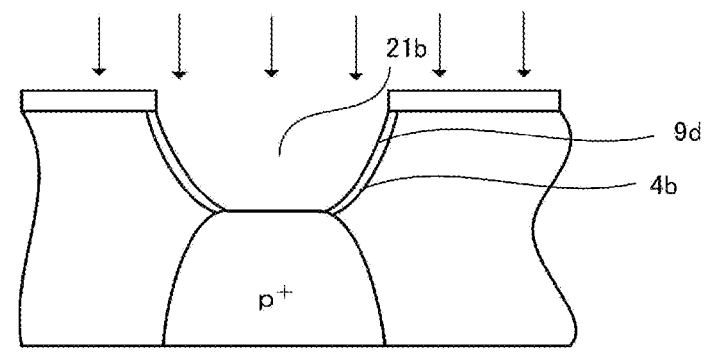
Figure 13D:
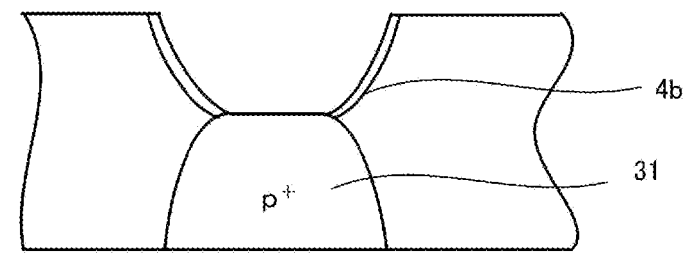

FIGS. 13(a) through 13(d) are sectional views showing the process featured in Example 5 according to embodiments of the invention in the order of processing or steps in the process. FIG. 13(a) is a sectional view showing a process or step of forming a non-passing-through V-groove 21b from the second principal surface opposite to the p type diffusion layer by alkali anisotropic etching using a resist mask 32. FIG. 13(b) is a sectional view showing a process or step of boron ion injection into the side surface 9c of the non-passing-through V-groove using the same resist mask 32. FIG. 13(c) is a sectional view showing a process or step of laser irradiation for activating the boron injection layer formed on the side surface 9c to form the isolation layer 4b and simultaneously for chamfering the bottom part of the side surface 9c. FIG. 13(d) is a sectional view showing that the resist mask 32 is removed and that the p type isolation layer 4b and the p type diffusion layer 31 are connected. As a result, a p type diffusion layer is continuously formed from the first principal surface to the second principal surface of the wafer 1 and an end of the collector pn junction formed in the second principal surface side is extended to the first principal surface side that is the front surface side. After that, a boron ion injection layer is formed on the second principal surface that is surrounded by the side surfaces of the non-passing-through V-groove 21b and made in connection with the rear side end of the p type isolation layer 4b. The ion injection layer is activated to form a p type collector layer.

EXAMPLE 6

Example 6 according to embodiments of the present invention is described in the following focusing on the features of the embodiment example. Besides the features in Example 5, the embodiments of the invention in Example 6 provide a manufacturing method that activates the isolation layer on the side surface of the non-passing-through V-groove and the p type collector layer on the rear surface simultaneously by laser irradiation. The ion injection process for both of the side surface of the non-passing-through V-groove and the p type collector layer on the rear surface injects boron ions under a condition of a dose amount of $1\times10^{14}/cm^2$ at 50 keV. The laser annealing is conducted under the conditions of YAG 2ω laser at a wavelength of 532 nm and a half width of 100 ns at an irradiation energy density of $4 J/cm^2$. The curve (b) of FIG. 11 shows an impurity concentration profile, obtained by the SR measurement, of the p type collector layer on the rear surface after the activation process by laser irradiation. The activation rate of the p type isolation layer is about 60%, and an element exhibiting a reverse blocking performance is obtained. This laser irradiation process activates both the isolation layer on the side surface of the non-passing-through V-groove and the p type collector layer on the rear surface and simultaneously forms a non-passing-through V-groove that has a bottom part of the corner with a chamfered configuration of a radius of curvature R of at least 50 μm.

Figure 12:
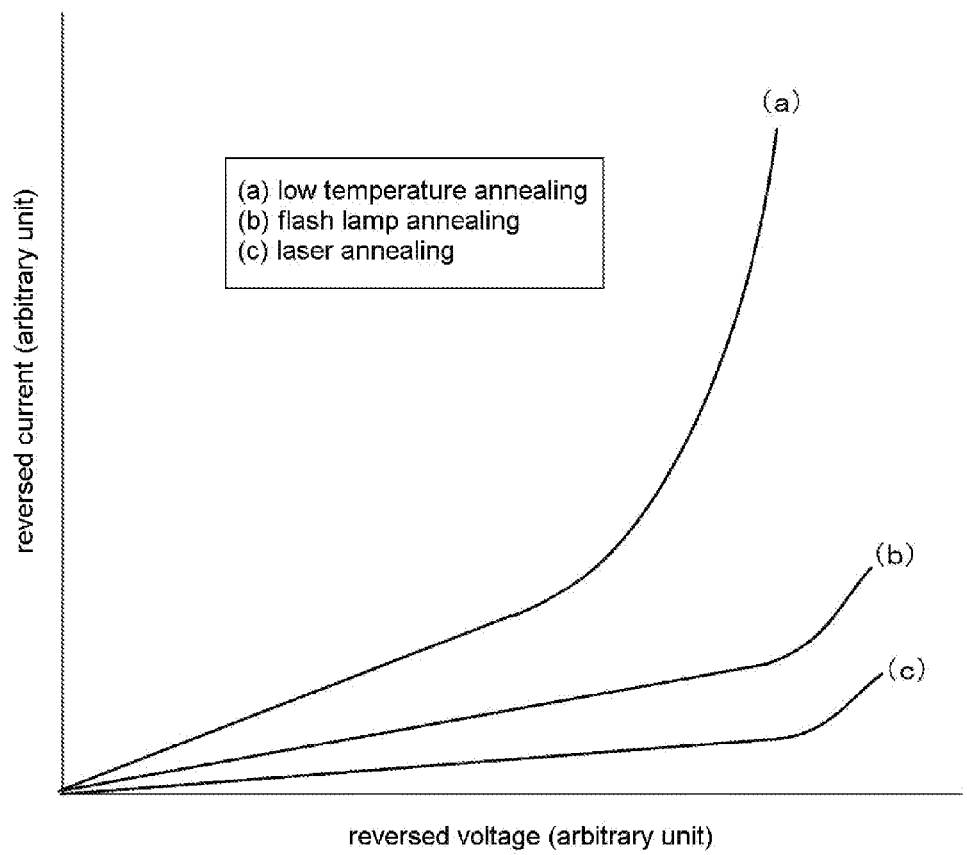
FIG. 12 shows current-voltage waveforms in the reversed direction for comparing magnitudes of reverse leakage current depending on annealing methods for the isolation layer in a reverse blocking IGBT according to embodiments of the present invention.

FIG. 12 shows current-voltage waveforms in the reversed direction for comparing magnitudes of reverse leakage current depending on annealing methods for the isolation layer in a reverse blocking IGBT. The curve (a) is a current-voltage waveform of a reverse blocking IGBT manufactured employing the low temperature furnace annealing process in Examples 2 and 4. The curve (b) is a current-voltage waveform of a reverse blocking IGBT manufactured employing the flash lamp annealing process in Examples 3 and 4. The curve (c) is a current-voltage waveform of a reverse blocking IGBT manufactured employing the laser annealing process in Examples 5 and 6. All of the curves (a), (b) and (c) shows the leakage current in the reversed direction within the established standards and the reverse blocking IGBTs are good products. The leakage current is the lowest for the laser annealing, next lowest for the flash lamp annealing, and the highest for the low temperature furnace annealing. The reason for this fact is because the laser annealing process forms a corner part of the non-passing-through V-groove with a roundly chamfered configuration and further, recovers crystal lattice defects in the isolation layer on the side surface of the non-passing-through V-groove and in the p type collector layer on the rear surface.

Figure 14A:
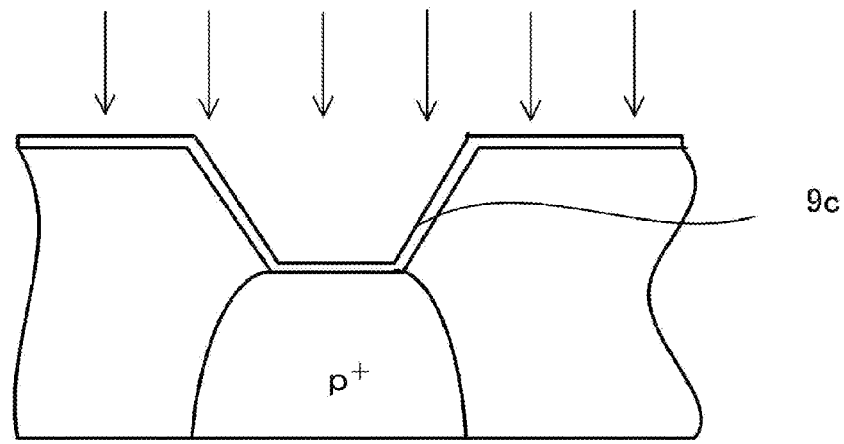
FIGS. 14(a) and 14(b) are sectional views of an essential part showing processes or steps of fabricating a non-passing-through type V-groove and an isolation layer in Example 6 of an embodiment according to the present invention.
Figure 14B:
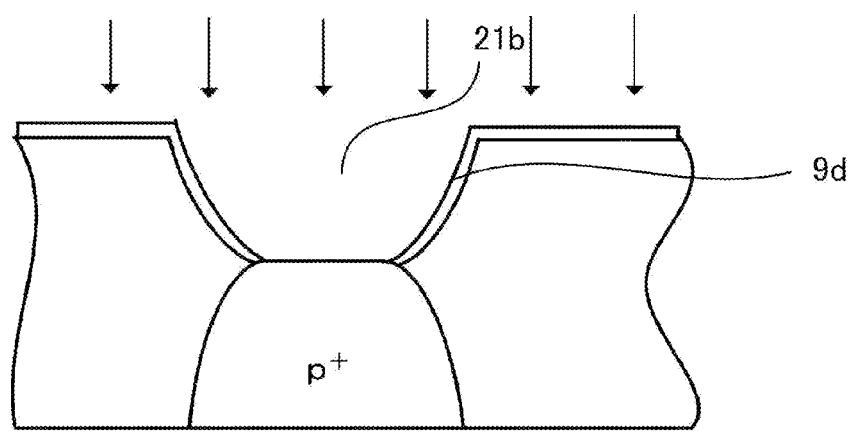
Figure 15:
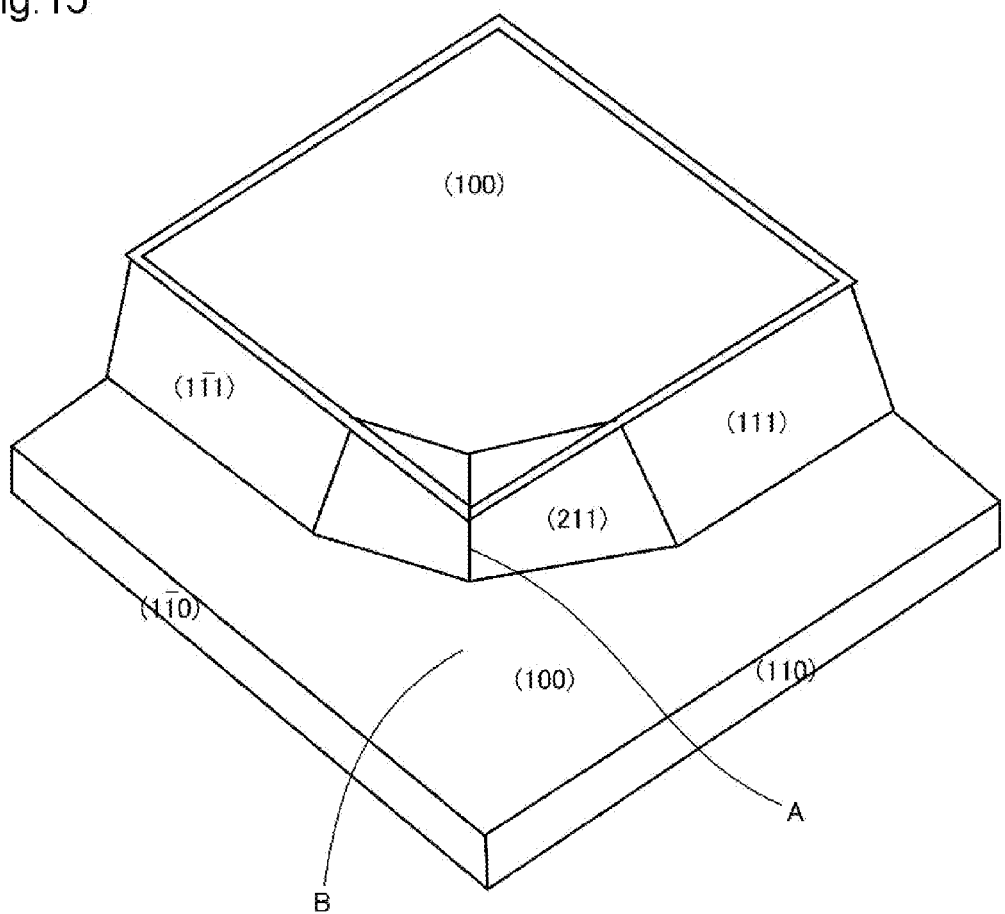
FIG. 15 is a perspective view of an essential part of a semiconductor substrate around one of the corners at the crossing part of the non-passing-through type V-grooves in a planar lattice pattern.
Figure 16A:
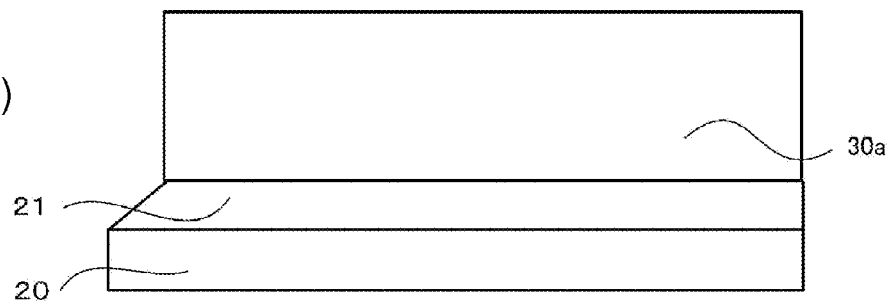
Figure 16B:
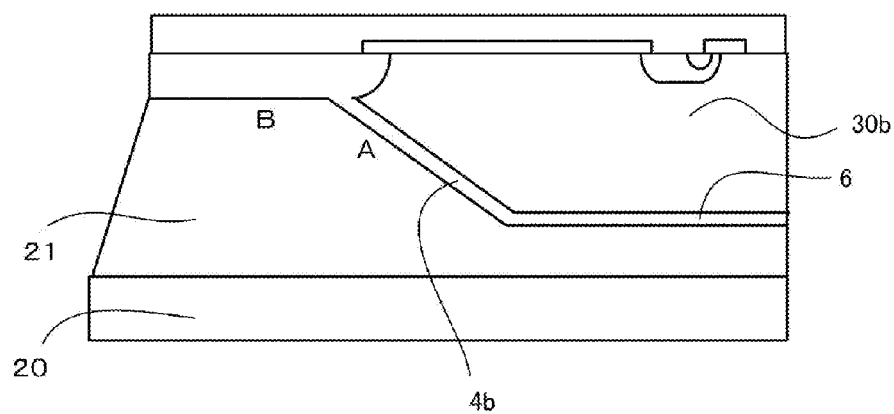
Figure 17:
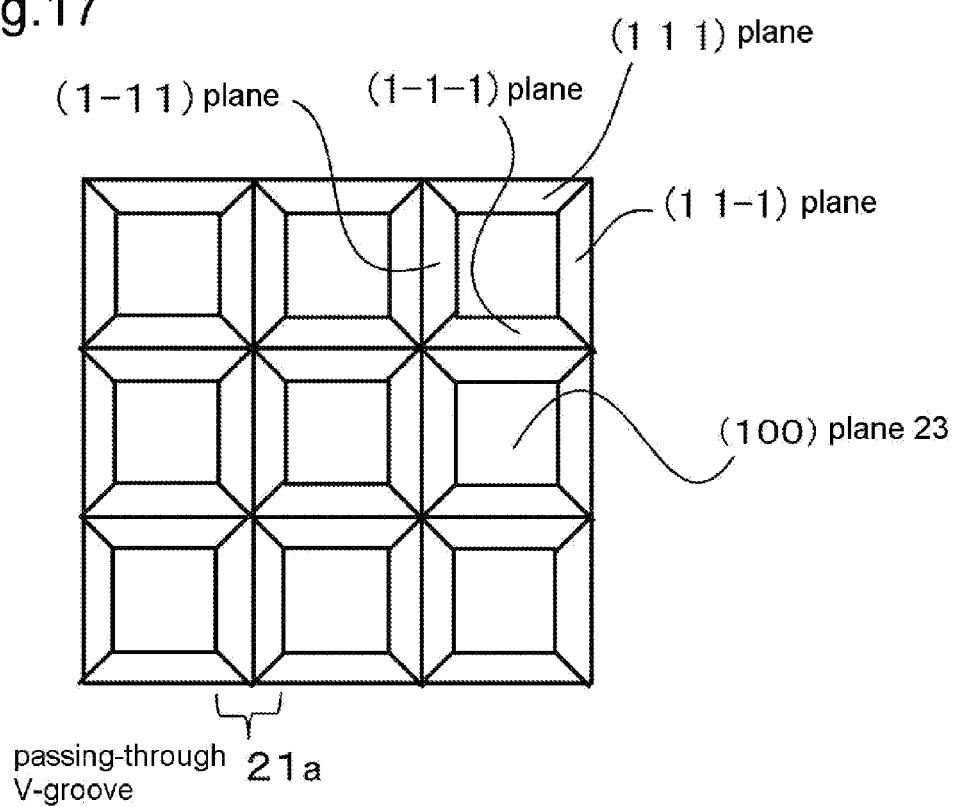
FIG. 17 is a partial plan view of a semiconductor substrate having passing-through V-grooves in a planar lattice pattern formed thereon.

FIGS. 14(a) and 14(b) are sectional views showing the process featured in Example 6 in the order of processing. It can be seen that the number of processes or steps is two processes or steps less in Example 6 of FIG. 14 than in Example 5 of FIG. 13. Example 6 is described in the case of YAG 2ω laser. However, another laser device selected from excimer laser of XeF and XeCl, fully solid state laser of YAG 3ω, and semiconductor laser can be employed for forming and simultaneously activating the tapered surface 9d of the non-passing-through V-groove 21b with a chamfered configuration. Moreover, a combination of the excimer laser and the semiconductor laser or a combination of the excimer laser and the fully solid state laser can be used without problem.

Use of the laser irradiation for forming the chamfered configuration of the corner part of the non-passing-through V-groove and for activating the ion injection layer forms an ion injection layer exhibiting high activation rate and avoids generation of a crack and a break due to stress concentration at the thin four corner parts, thus providing a reverse blocking semiconductor IGBT with good semiconductor performance and a manufacturing method therefor.

The description thus far is made in the case of laser irradiation as a method for the chamfering process in Examples 1 through 6. The chamfering process can also be carried out by an isotropic dry etching process. The dry etching process can be carried out using a well known material such as $XeF_4$, $CF_4$ or the like.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
a semiconductor substrate of a first conductivity type having a first principal surface and a second principal surface;
a diffusion layer of the second conductivity type in a planar lattice pattern on the first principal surface;
a V-groove formed on a side of the second principal surface in a planar lattice pattern with the same pitch as that of the planar lattice pattern of the diffusion layer and including a bottom surface parallel to the second principal surface and exposing the diffusion layer, and a tapered side surface rising from the bottom surface;
a semiconductor layer of the second conductivity type on the second principal surface surrounded by the tapered side surface; and
an isolation layer of the second conductivity type formed on the side surface of the V-groove, the isolation layer electrically connecting the diffusion layer of the second conductivity type on the side of the first principal surface and the semiconductor layer of the second conductivity type on the second principal surface, wherein
the V-groove has a chamfered configuration around an intersection between a corner part of the side surface of the V-groove and the bottom surface of the V-groove.

2. The semiconductor device according to claim 1, wherein the chamfered configuration is a curved surface.

3. The semiconductor device according to claim 2, wherein the curved surface of the chamfered configuration has a radius of curvature of at least 50 μm.

4. The semiconductor device according to claim 1, wherein the semiconductor device is a reverse blocking insulated gate bipolar transistor.

5. A method of manufacturing a semiconductor device, the method comprising:
forming a diffusion layer of a second conductivity type in a planar lattice pattern on a first principal surface of a semiconductor substrate of a first conductivity type, the semiconductor substrate having the first principal surface of a (100) plane and a second principal surface of the (100) plane;
forming a V-groove by an anisotropic etching process on the second principal surface in a planar lattice pattern with the same pitch as that of the planar lattice pattern of the diffusion layer, the V-groove comprising a bottom surface parallel to the second principal surface and exposing the diffusion layer of the second conductivity type, and a tapered side surface rising from the bottom surface;
chamfering a configuration around an intersection between a corner part of the side surface of the V-groove and the bottom surface of the V-groove by a process selected from a laser irradiation process and an isotropic dry etching process;
ion injection to form an isolation layer of the second conductivity type on the side surface of the V-groove, one end of the isolation layer connecting to the diffusion layer of the second conductivity type;
ion injection to form a semiconductor layer of the second conductivity type on the second principal surface surrounded by the side surface of the V-groove, the semiconductor layer connecting to the other end of the isolation layer of the second conductivity type on the side surface of the V-groove; and
annealing to activate, after the ion injection to form the isolation layer and the ion injection to form the semiconductor layer, by at least one annealing process selected from a laser irradiation annealing process, a low temperature annealing process, and a flash lamp annealing process.

6. The method of manufacturing a semiconductor device according to claim 5, wherein the ion injection to form the isolation layer of the second conductivity type and the ion injection to form the semiconductor layer of the second conductivity type are conducted simultaneously, and a single activation process is conducted simultaneously after the simultaneously conducted ion injection process.

7. The method of manufacturing a semiconductor device according to claim 5, wherein a single laser irradiation process is conducted simultaneously for an activation process after the ion injection to form the isolation layer of the second conductivity type, for an activation process after the ion injection to form the semiconductor layer of the second conductivity type, and for the chamfering.

8. The method of manufacturing a semiconductor device according to claim 7, wherein a single ion injection process is conducted simultaneously for the ion injection to form the isolation layer of the second conductivity type and for the ion injection to form the semiconductor layer of the second conductivity type.

\* \* \* \* \*